(12) United States Patent
Tsugane et al.

(10) Patent No.: US 6,982,466 B2
(45) Date of Patent: Jan. 3, 2006

(54) SEMICONDUCTOR DEVICES INCLUDING A SILICIDE LAYER

(75) Inventors: Hiroaki Tsugane, Sakata (JP); Hisakatsu Sato, Sakato (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/805,334

(22) Filed: Mar. 22, 2004

(65) Prior Publication Data

US 2004/0173833 A1    Sep. 9, 2004

Related U.S. Application Data

(62) Division of application No. 09/759,665, filed on Jan. 13, 2001, now Pat. No. 6,753,226.

(30) Foreign Application Priority Data

Jan. 13, 2000    (JP)    ................................. 2000-5042

(51) Int. Cl.
*H01L 21/20*    (2006.01)

(52) U.S. Cl. ...................... 257/382; 257/303; 257/304; 257/305; 257/306; 365/149; 365/154

(58) Field of Classification Search ................ 257/296, 257/303–306, 377, 382, 384, 388; 365/149, 365/154
See application file for complete search history.

(56) References Cited

U.S. PATENT DOCUMENTS 6,043,537 A * 3/2000 Jun et al. ................... 257/350
2001/0005610 A1 * 6/2001 Fukase et al. .............. 438/239

* cited by examiner

*Primary Examiner*—Nathan J. Flynn
*Assistant Examiner*—Thomas L. Dickey
(74) *Attorney, Agent, or Firm*—Konrad Raynes & Victor, LLP; Alan S. Raynes

(57) ABSTRACT

Embodiments of the present invention include a method for manufacturing a semiconductor device and a semiconductor device, in which, when a DRAM and a MOS field effect transistor that becomes a component of a logic circuit are mix-mounted on the same chip, the DRAM and the MOS field effect transistor can be provided with designed performances. After a capacitor 700 of the DRAM is formed, silicide layers 19a and 19b are formed over N$^+$ type source/drain regions 41c and 41d of MOS field effect transistors 200c, 200d and 200e that are located in peripheral circuit region 2000 and logic circuit region 3000.

10 Claims, 19 Drawing Sheets

SEMICONDUCTOR DEVICES INCLUDING A SILICIDE LAYER

This is a divisional of U.S. application Ser. No. 09/759,665, filed Jan. 13, 2001, now U.S. Pat. No. 6,753,226, which is hereby incorporated by reference in its entirety. Japanese patent application no. 2000-5042, filed Jan. 13, 2000, is hereby incorporated by reference in its entirety. U.S. patent application Ser. No. 09/759,666, filed on Jan. 13, 2001, is hereby incorporated by reference in its entirety. U.S. patent application Ser. No. 09/759,915, now U.S. Pat. No. 6,784,047, filed on Jan. 13, 2001, is hereby incorporated by reference in its entirety. U.S. patent application Ser. No. 09/759,715, filed on Jan. 13, 2001, is hereby incorporated by reference in its entirety.

TECHNICAL FIELD

The present invention relates to methods for manufacturing semiconductor devices that mix-mount DRAMs (Dynamic Random Access Memories) and other device elements in the same chip, and semiconductor devices manufactured thereby.

BACKGROUND

In recent years, the mixed-mounting of various types of circuits is required in consideration of various factors, such as, for example, to shorten the chip interface delay, to reduce the cost per board area, and to reduce the cost in design and development of boards. There are problems in the mix-mounting technology in that the process becomes complex and the IC cost increases.

SUMMARY

One embodiment of the present invention relates to a method for manufacturing a semiconductor device, the semiconductor device having a DRAM located in a memory cell region and a field effect transistor located in a field effect transistor region that is a region other than the memory cell region. The method includes (a) forming a capacitor for the DRAM; and (b) after step (a), forming a silicide layer at a source/drain region of the field effect transistor.

Another embodiment relates to a method for manufacturing a semiconductor device, the semiconductor device having a DRAM located in a memory cell region, a first field effect transistor that is located in a peripheral circuit region and becomes a component of a peripheral circuit for the DRAM, and a second field effect transistor located in a region other than the memory cell region and the peripheral circuit region. The method includes (A) forming the first field effect transistor with a source/drain that does not have a silicide layer in the peripheral circuit region. Step (B), after step (A), includes forming a capacitor for the DRAM. Step (C), after step B, includes forming a silicide layer at a source/drain of the second field effect transistor.

Another embodiment relates to a semiconductor device including a DRAM located in a memory cell region, and a field effect transistor located in a field effect transistor region that is a region other than the memory cell region. The device also includes silicide layers formed at a cell plate that is a component of a capacitor of the DRAM and at a source/drain that is a component of the field effect transistor. In addition, silicide layers are not formed at a source/drain that is a component of a memory cell selection field effect transistor of the DRAM.

Another embodiment relates to a semiconductor device including a DRAM located in a memory cell region. The device also includes a first field effect transistor that is located in a peripheral circuit region and becomes a component of a peripheral circuit for the DRAM, and a second field effect transistor located in a region other than the memory cell region and the peripheral circuit region. The device also includes silicide layers formed at a cell plate that is a component of a capacitor of the DRAM and at a source/drain of the second field effect transistor. In addition, silicide layers are not formed at a source/drain that is a component of a memory cell selection field effect transistor of the DRAM or at a source/drain of the first field effect transistor.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
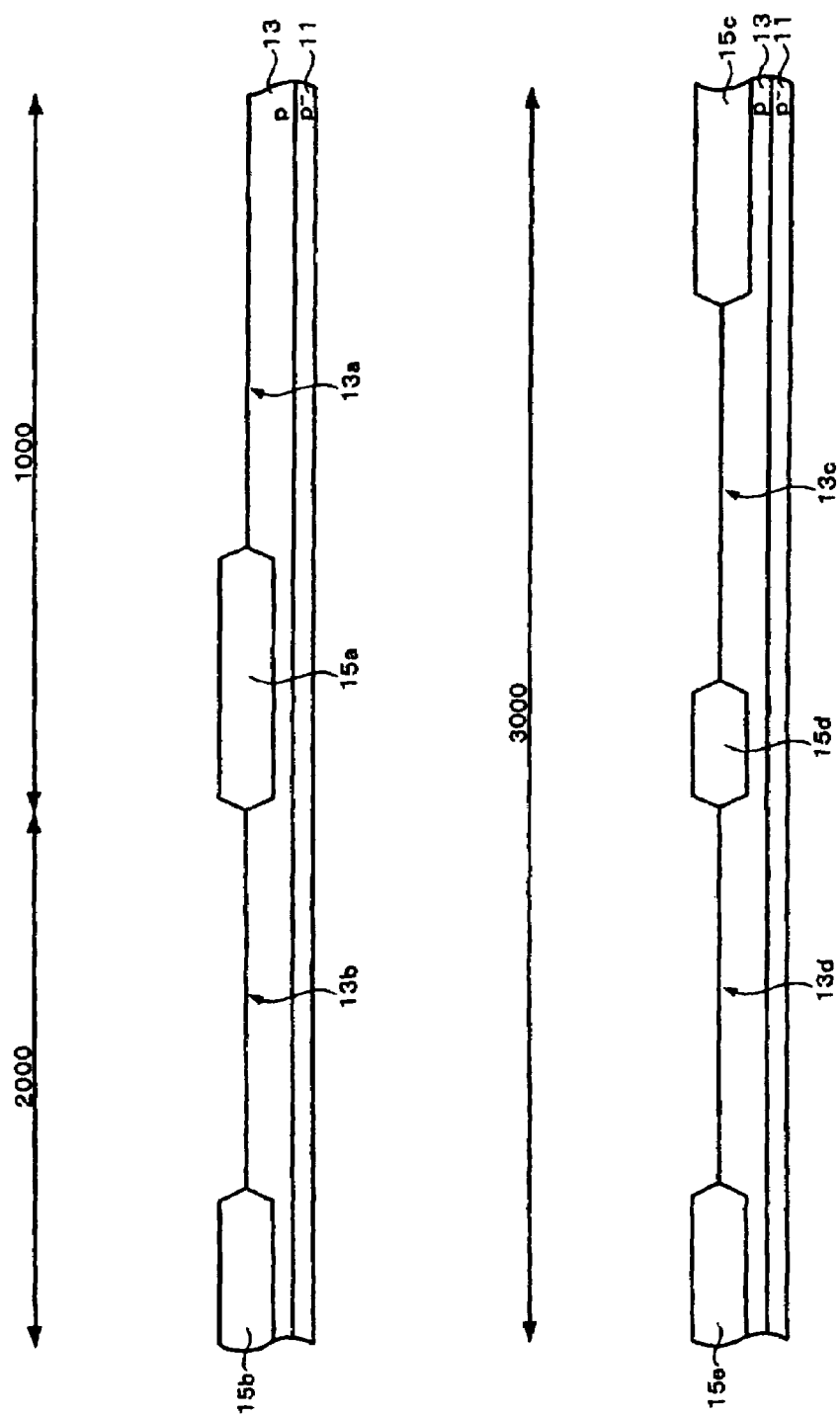
FIG. 1 schematically shows a cross section of a silicon substrate, which is used to describe a first step in a method for manufacturing a semiconductor device of an embodiment of the present invention.

Certain embodiments of the present invention to methods for manufacturing semiconductor devices having a DRAM and another element that are mounted on the same chip, which can provide the DRAM and the other element with designated performances, and semiconductor devices manufactured thereby.

One embodiment provides a method for manufacturing a semiconductor device, the semiconductor device having a DRAM located in a memory cell region and a field effect transistor located in a field effect transistor region that is a region other than the memory cell region, the method comprising the steps of: (a) forming a capacitor for the DRAM; and after the step (a), (b) forming a silicide layer at a source/drain region of the field effect transistor.

By the method for manufacturing a semiconductor device including the above-described steps, a chip that mix-mounts a DRAM and a field effect transistor formed with a silicide at its source/drain is manufactured. In accordance with this embodiment, the capacitor for the DRAM is inhibited or prevented from being polluted by metals. The reasons therefor are described below.

For a higher speed of a field effect transistor, a silicide layer may be formed at source/drain of the field effect transistor. Through the step of forming the silicide layer, metals inevitably adhere to the semiconductor manufacturing apparatus. If the metals are contained in a dielectric layer of a capacitor, the characteristic of the capacitor deteriorates, which adversely affects the performance of the RAM. In accordance with certain embodiments of the present invention, after the capacitor for the DRAM is formed, the silicide layers are formed at the source/drain of the field effect transistor. Therefore, the metal-pollution of the capacitor is inhibited or prevented.

Also, in accordance with certain embodiments of the present invention, since the silicide layer is formed at the source/drain of the field effect transistor after the capacitor for the DRAM is formed, the resistance of the silicide layer is prevented from increasing. In other words, if the silicide layer were to be formed before the capacitor is formed, the silicide layer is affected by the heat generated during the formation of the capacitor, and therefore the resistance of the silicide layer increases.

It is noted that in certain embodiments, a field effect transistor region refers to a region other than a memory cell region. A field effect transistor located in a field effect transistor region defines a component of, for example, a logic circuit and a peripheral circuit for a DRAM (including a sense amplifier). The same definition applies to field effect transistors described below.

One example of a semiconductor device manufactured by an embodiment of the present invention is as follows. The semiconductor device is equipped with a DRAM located in a memory cell region, and a field effect transistor located in a field effect transistor region that is a region other than the memory cell region. The semiconductor device is characterized in that silicide layer are formed at a cell plate that defines a component of a capacitor of the DRAM and at a source/drain that defines a component of the field effect transistor, but silicide layers are not formed at a source/drain that defines a component of a memory cell selection field effect transistor of the DRAM.

In certain embodiments of the present invention, a silicide layer is not formed at a source/drain that defines a component of a memory cell selection field effect transistor because of the following reasons. The leak current of the memory cell selection field effect transistor is a source of deterioration in the charge-retaining characteristic of a DRAM capacitor. In this respect, a reduced leak current is required more than a higher operation speed in a memory cell selection field effect transistor. If a silicide layer is formed at the source/drain of the memory cell selection field effect transistor, the leak current increases.

In a method for manufacturing a semiconductor device in accordance with the certain embodiments of present invention, the following steps may be added. Before the step (a) described above, the method includes the steps of (c) forming an etching stopper layer in the field effect transistor region, and (d) forming an interlayer dielectric layer in the memory cell region and the field effect transistor region, and further includes, between the step (a) and the step (b), the step of (e) removing the interlayer dielectric layer located in the field effect transistor region by an etching, using the etching stopper layer as an etching stopper.

In accordance with embodiments with the above-described steps being added, when the interlayer dielectric layer is removed by an etching, an underlying layer (for example, an element isolation insulation layer) is prevented from being cut in an area where the interlayer dielectric layer is relatively thin. In other words, in accordance with certain embodiments the present invention, a capacitor for the DRAM is formed after an interlayer dielectric layer is formed in the memory cell region. Since the interlayer dielectric layer is formed over the surface of the semiconductor substrate, it is also formed over the field effect transistor region. Therefore, before a silicide is formed, the interlayer dielectric layer located in the field effect transistor region needs to be removed. It is noted that variations in the thickness of the interlayer dielectric layer unavoidably occur, and areas of the interlayer dielectric layer that are thinner are etched and removed first, compared to areas thereof having a greater thickness. As a result, when the interlayer dielectric layer is removed, and if there is not an etching stopper layer below the interlayer dielectric layer, an underlying layer such as an element isolation insulation layer is etched in areas where the thickness of the interlayer dielectric layer are small. As a result, problems such as a lowered element isolation dielectric strength and the like occur. In accordance with certain embodiments of the present invention, an etching stopper layer is formed below the interlayer dielectric layer. As a result, when the interlayer dielectric layer is removed, an underlying layer such as an element isolation insulation layer in areas where the thickness of the interlayer dielectric layer are small can be inhibited or prevented from being etched.

In a method for manufacturing a semiconductor device in accordance with certain embodiments of the present invention, the following steps may be added. After the step (b), the method includes the steps of (f) forming another interlayer dielectric layer in the memory cell region and the field effect transistor region, and (g) polishing the other interlayer dielectric layer by CMP (chemical mechanical polishing) to thereby planarize the other interlayer dielectric layer.

In accordance with certain embodiments of the present invention with the above-described steps being added, the other interlayer dielectric layer is planarized by a CMP method, with the result that the reliability of a wiring layer to be formed over the other interlayer dielectric layer can be improved.

In a method for manufacturing a semiconductor device in accordance with certain embodiments of the present invention, the following steps may be added. After the step (b), the method may include the steps of (f) forming another interlayer dielectric layer in the memory cell region and the field effect transistor region, and (g) photo-etching the other interlayer dielectric layer located in the memory cell region to thereby planarize the other interlayer dielectric layer. Photo-etching refers to the deposition of photoresist, then exposure to form a pattern, and then etching, as known in the art.

In accordance with embodiments of the present invention with the above-described steps being added, the other interlayer dielectric layer is planarized by an etchback, with the result that the reliability of wiring layers to be formed over the other interlayer dielectric layer can be improved.

In a method for manufacturing a semiconductor device in accordance with certain embodiments of the present invention, the following step may be added. The step (b) described above includes the step of forming a silicide wiring layer that connects to the source/drain regions of the field effect transistor. The silicide wiring layer is used, for example, to connect the source/drain of the field effect transistor to other elements. In accordance with certain embodiments of the present invention with the above-described step being added, the source/drain of the field effect transistor can be connected to the other elements without adding a wiring step.

One example of a semiconductor device manufactured in accordance with certain embodiments of the present invention is as follows. The semiconductor device described above further includes a silicide wiring layer, wherein the silicide wiring layer is connected to the source/drain of the field effect transistor, and the silicide wiring layer is located in the same layer as a silicide layer of the source/drain of the field effect transistor.

In a method for manufacturing a semiconductor device in accordance with certain embodiments of the present invention, the following step may be added. Another field effect transistor with a source/drain that does not have a silicide layer is located in the field effect transistor, and the method further includes, before the step (b), the step of (h) forming a protection layer in a region where the other field effect transistor is to be formed.

In accordance with embodiments of the present invention with the above-described step being added, a field effect transistor with its source/drain that has a silicide layer and another field effect transistor with its source/drain that does not have a silicide layer can be formed in a field effect transistor region. Depending on the use of the semiconductor device, there may be instances where the other field effect transistor is required. For example, the other field effect transistor may be used as an element that composes a peripheral circuit for a DRAM. In other words, when a DRAM macro cell (a memory cell and a peripheral circuit) and a logic circuit are mix-mounted, a silicide layer is not generally formed at source/drain of a memory cell selection field effect transistor. This is to reduce the leak current, as described above. When a DRAM macro cell is designed, using memory cells of a general-purpose DRAM, the design of the DRAM macro cell becomes easier if a silicide layer is not present at a source/drain of a transistor located in the peripheral circuit for the DRAM.

Certain embodiments of the present invention provide a method for manufacturing a semiconductor device, the semiconductor device having a DRAM located in a memory cell region, a first field effect transistor that is located in a peripheral circuit region and becomes a component of a peripheral circuit for the DRAM, and a second field effect transistor located in a region other than the memory cell region and the peripheral circuit region. The method comprises the steps of: (A) forming the first field effect transistor with a source/drain that does not have a silicide layer in the peripheral circuit region; after the step (A), (B) forming a capacitor for the DRAM; and after the step (B), (C) forming a silicide layer at a source/drain of the second field effect transistor.

By the method for manufacturing a semiconductor device as described above, the capacitor for the DRAM is inhibited or prevented from being polluted by metals, and the resistance of the silicide layer formed at the source/drain of the second field effect transistor is prevented from increasing.

Also, in the method for manufacturing a semiconductor device as described above, the first field effect transistor and the second field effect transistor are formed by independent steps. As a result, the transistors can be independently optimized.

It is noted that, in embodiments of the present invention, regions other than the memory cell region and the peripheral circuit region refer to, for example, a logic circuit region.

One example of a semiconductor device manufactured in accordance with an embodiment of the present invention is as follows. Namely, the semiconductor device comprises a DRAM located in a memory cell region, a first field effect transistor that is located in a peripheral circuit region and becomes a component of a peripheral circuit for the DRAM, and a second field effect transistor located in a region other than the memory cell region and the peripheral circuit region. The semiconductor device is characterized in that silicide layers are formed at a cell plate that is a component of a capacitor of the DRAM and at a source/drain that is a component of the second field effect transistor, but silicide layers are not formed at a source/drain that is a component of a memory cell selection field effect transistor of the DRAM or at a source/drain that is a component of the first field effect transistor.

Figure 12:
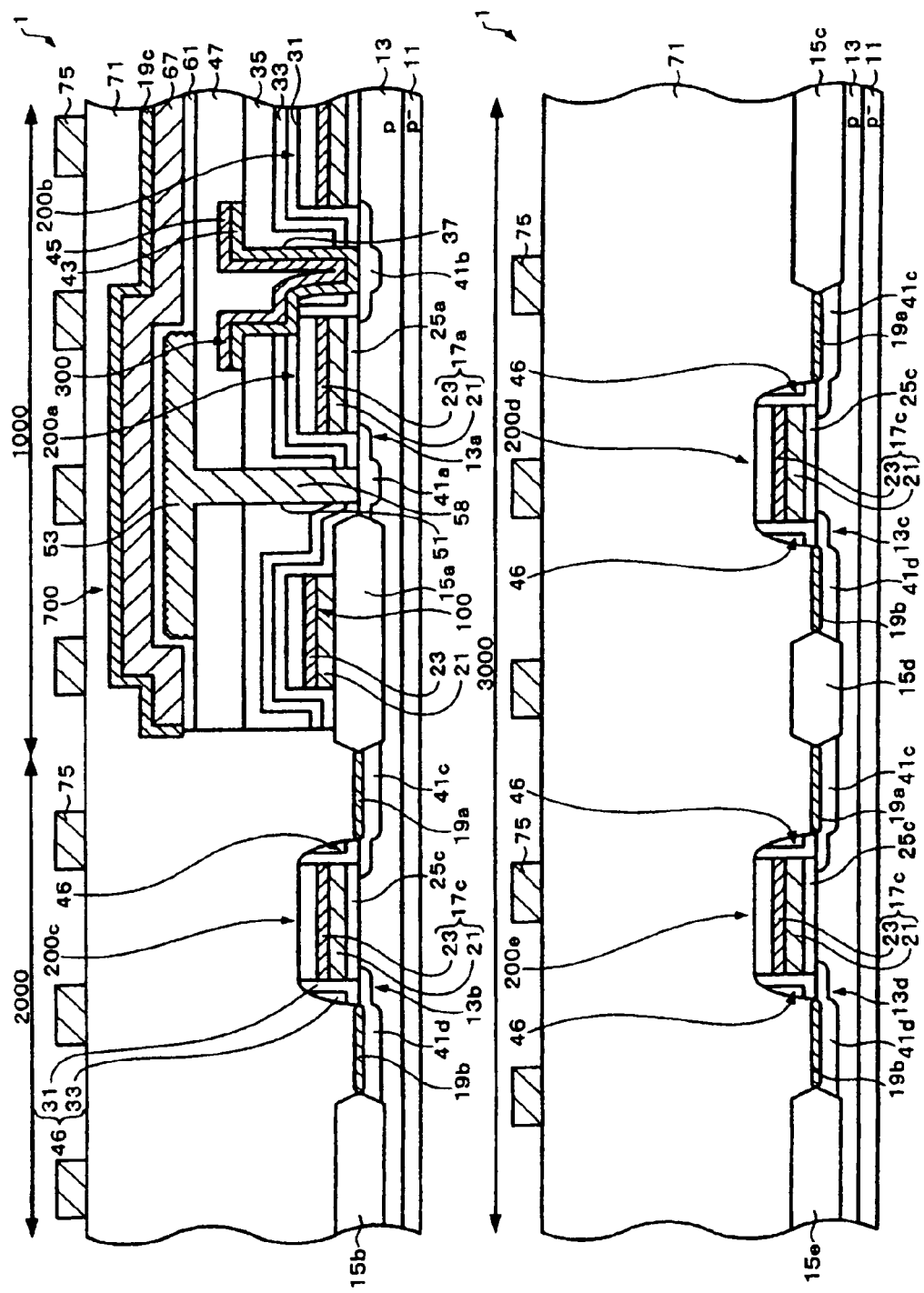
FIG. 12 schematically shows a cross section of the semiconductor device in accordance with the method as illustrated in FIGS. 1–11 for manufacturing a semiconductor device of an embodiment of the present invention.

Preferred embodiments of the present invention will be described with reference to the accompanying drawings. FIG. 12 schematically shows a cross section of a semiconductor device manufactured by a method for manufacturing a semiconductor device in accordance with one embodiment of the present invention. The semiconductor device 1 includes a DRAM region 1000, a peripheral circuit region for a DRAM 2000, and a logic circuit region 3000. The semiconductor device 1 is a DRAM mixed-mount type, in which a DRAM macro cell is formed from a memory cell array formed in the DRAM region 1000 and a peripheral circuit formed in the peripheral circuit region 2000.

The DRAM region 1000 includes a word line 100, MOS (Metal Oxide Semiconductor) field effect transistors 200a and 200b, a bit line 300, and a capacitor 700. The MOS field effect transistors 200a and 200b are memory cell selection field effect transistors. The MOS field effect transistor 200a and the capacitor 700 form one memory cell.

A MOS field effect transistor 200c is located in the peripheral circuit region 2000. The MOS field effect transistor 200c defines a component of a peripheral circuit for a DRAM.

MOS field effect transistors 200d and 200e are located in the logic circuit region 3000. The MOS field effect transistors 200d and 200e define components of the logic circuit.

The semiconductor device 1 generally has the structure as described above. Next, a structure of the DRAM region 1000 is described in detail. Then, a structure of the peripheral circuit region 2000, and a structure of the logic circuit region 3000 will be described in detail.

A preferred structure of the DRAM region 1000 is as follows. A P type well 13 is formed in a P-type silicon substrate 11. A field oxide layer 15a is selectively formed on the P type well 13. A region that is defined by the field oxide layer 15a and another field oxide layer that is not shown in the figure among the P type well 13 defines an active region 13a. The MOS field effect transistors 200a and 200b are formed in the active region 13a. Also, the word line 100 is located over the field oxide layer 15a.

First, the MOS field effect transistor 200a is described. The MOS field effect transistor 200a is equipped with a gate electrode (word line) 17a, an N$^+$ type source/drain region 41a, and an N$^+$ type source/drain region 41b. The N$^+$ type source/drain region 41a and the N$^+$ type source/drain region 41b are located on the surface of the active region 13a and spaced from each other. The gate electrode 17a is located through a gate oxide layer 25a over a region between the N$^+$ type source/drain region 41a and the N$^+$ type source/drain region 41b among the active region 13a. The gate electrode 17a has a structure having a polycrystal silicon layer 21 and a tungsten silicide layer 23 located thereon. The MOS field effect transistor 200a has the structure described above. The MOS field effect transistor 200b also has the structure as that of the MOS field effect transistor 200a, and therefore a separate description of the MOS field effect transistor 200b is omitted.

The word line 100 has a structure having a polycrystal silicon layer 21 and a tungsten silicide layer 23 located thereon.

A TEOS layer 31, a silicon nitride layer 33 and an interlayer dielectric layer 35 are successively provided in a manner to cover the MOS field effect transistors 200a and 200b and the word line 100. The interlayer dielectric layer 35 may be formed from, for example, a silicon oxide layer. A contact hole 37 is formed in the interlayer dielectric layer 35. The contact hole 37 reaches the N$^+$ type source/drain region 41b. The bit line 300 is located above the interlayer dielectric layer 35. The bit line 300 passes through the contact hole 37 and electrically connects to the N$^+$ type source/drain region 41b. The bit line 300 has a structure including a polycrystal silicon layer 43 and a tungsten silicide layer 45 located thereon.

An interlayer dielectric layer 47 is located in a manner to cover the bit line 300. The interlayer dielectric layer 47 may be formed from, for example, a silicon oxide layer. A contact hole 51 is formed in a layer composed of the interlayer dielectric layers 47 and 35, the silicon nitride layer 33 and the TEOS layer 31. The contact hole 51 reaches the N$^+$ type source/drain region 41a.

The capacitor 700 is located above the interlayer dielectric layer 47. The capacitor 700 includes a storage node 53, an ON layer 61 and a cell plate 67. The storage node 53 is located above the interlayer dielectric layer 47. The storage node 53 connects to the N$^+$ type source/drain region 41a through a conductive layer 58 that is filled in the contact hole 51. The storage node 53 and the conductive layer 58 are polycrystal silicon layers, and are integrally formed. The ON layer 61 is located in a manner to cover the storage node 53. The ON layer 61 is formed from a silicon oxide layer and a silicon nitride layer, and functions as a dielectric layer. The cell plate 67 is located in a manner to cover the ON layer 61. The cell plate 67 is a polycrystal silicon layer. A silicide layer 19c is located over the cell plate 67.

An interlayer dielectric layer 71 is located in a manner to cover the capacitor 700. The interlayer dielectric layer 71 may be formed from, for example, a silicon oxide layer. A plurality of wirings, for example, aluminum wirings 75 are located above the interlayer dielectric layer 71. The detailed description of the structure of the DRAM region 1000 is completed.

A preferred structure of the peripheral circuit region 2000 is as follows. A P type well 13 is formed in a P$^-$ type silicon substrate 11. A field oxide layer 15b is selectively formed on the P type well 13. A region that is defined by the field oxide layer 15a and the field oxide layer 15b among the P type well 13 defines an active region 13b. The MOS field effect transistor 200c is formed in the active region 13b.

The MOS field effect transistor 200c is equipped with a gate electrode 17c, an N$^+$ type source/drain region 41c, and an N$^+$ type source/drain region 41d. The N$^+$ type source/drain region 41c and the N$^+$ type source/drain region 41d are located on the surface of the active region 13b and spaced from each other. Silicide layers 19a and 19b are located above the N$^+$ type source/drain regions 41c and 41d, respectively. The gate electrode 17c is located through a gate oxide layer 25c over a region between the N$^+$ type source/drain region 41d and the N$^+$ type source/drain region 41c among the active region 13b. The gate electrode 17c has a structure having a polycrystal silicon layer 21 and a tungsten silicide layer 23 located thereon. Sidewalls 46 are located on both sides of the gate electrode 17c. The sidewall 46 is formed from a silicon nitride layer 33 and a TEOS layer 31 that is located between the silicon nitride layer 33 and the gate electrode 17c.

An interlayer dielectric layer 71 is located in a manner to cover the MOS field effect transistor 200c. The interlayer dielectric layer 71 may be formed from, for example, a silicon oxide layer. A plurality of wirings, for example, aluminum wirings 75 are located above the interlayer dielectric layer 71.

A preferred structure of the logic circuit region 3000 is as follows. A P type well 13 is formed in a P$^-$ type silicon substrate 11. Field oxide layers 15c, 15d and 15e are selectively formed on the P type well 13. A region that is defined by the field oxide layer 15c and the field oxide layer 15d among the P type well 13 defines an active region 13c. A region that is defined by the field oxide layer 15d and the field oxide layer 15e among the P type well 13 defines an active region 13d. The MOS field effect transistors 200d and 200e are formed in the active regions 13c and 13d, respectively. The MOS field effect transistors 200d and 200e have the same structure as that of the MOS field effect transistor 200c, and therefore a separate description thereof is omitted.

An interlayer dielectric layer 71 is located in a manner to cover the MOS field effect transistors 200d and 200e. The interlayer dielectric layer 71 may be formed from, for example, a silicon oxide layer. A plurality of wirings, for example, aluminum wirings 75 are located above the interlayer dielectric layer 71.

A method for manufacturing the semiconductor device 1 shown in FIG. 12 in accordance with an embodiment of the present invention is described with reference to FIGS. 1 through 11. FIGS. 1 through 11 show steps of the method for manufacturing the semiconductor device 1.

First, steps of forming gate electrodes 17a and 17c and a word line 100 shown in FIG. 12 are described with reference to FIGS. 1 and 2.

As shown in FIG. 1, field oxide layers 15a, 15b, 15c, 15d and 15e are formed on the surface of a P$^-$ type semiconductor substrate 11 by a selective oxide method, for example. The field oxide layer 15a is formed in the DRAM region 1000. The field oxide layer 15b is formed in the peripheral circuit region 2000. The field oxide layers 15c, 15d and 15e are formed in the logic circuit region 3000.

Next, a p-type impurity (for example, boron) is ion-implanted in the surface of the P$^-$ type semiconductor substrate 11, to thereby form a P type well 13 in the P$^-$ type semiconductor substrate 11. Among the P type well 13, a region that is defined by the field oxide layer 15a and another field oxide layer (not shown in the figure) becomes an active region 13a. Also, among the P type well 13, a region that is defined by the field oxide layer 15a and the field oxide layer 15b becomes an active region 13b. Also, among the P type well 13, a region that is defined by the field oxide layer 15c and the field oxide layer 15d becomes an active region 13c. Also, among the P type well 13, a region that is defined by the field oxide layer 15d and the field oxide layer 15e becomes an active region 13d.

Figure 2:
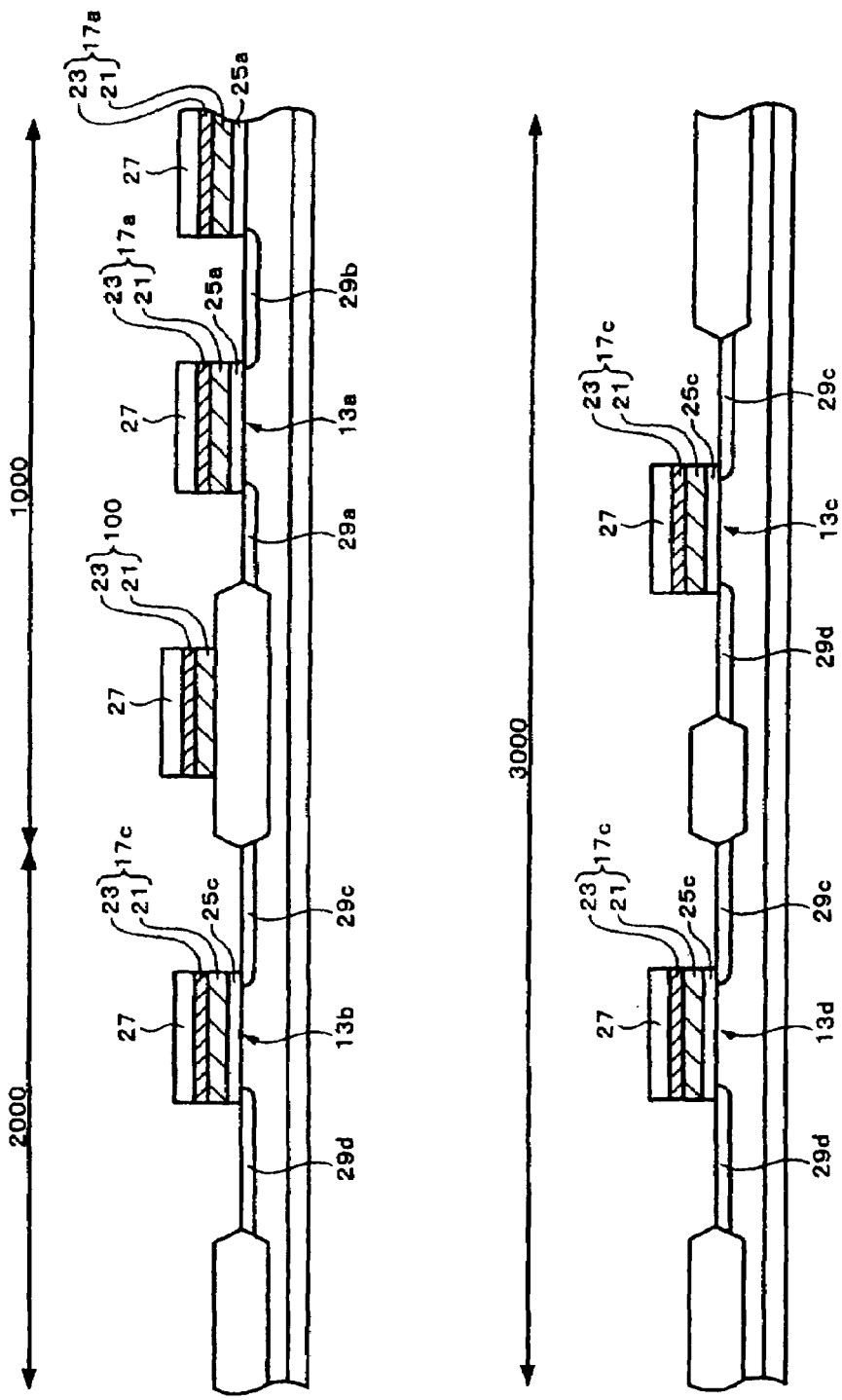
FIG. 2 schematically shows a cross section of the silicon substrate, which is used to describe a second step in a method for manufacturing a semiconductor device of an embodiment of the present invention.

As shown in FIG. 2, the P$^-$ type semiconductor substrate 11 is, for example, thermally oxidized to form thermal oxide layers that become gate oxide layers 25a and 25c over the active regions 13a, 13b, 13c and 13d. Then, a doped amorphous silicon layer is formed on the thermal oxide layers by using, for example, a CVD method. The doped amorphous silicon layer becomes a component of a gate electrode and the like. The doped amorphous silicon layer becomes a polycrystal silicon layer 21 in a heat treatment conducted during the manufacturing process. Then, a tungsten silicide layer 23 is formed over the doped amorphous silicon layer by using, for example, a CVD method. Next, a silicon oxide layer 27 that becomes a cap layer is formed over the tungsten silicide layer 23 by, for example, a CVD method.

A structure having the thermal oxide layer, the doped amorphous silicon layer, the tungsten silicide layer 23 and the silicon oxide layer 27 is subject to a specified patterning by, for example, photolithography and etching. As a result, a word line 100 and gate electrodes 17a are formed in the DRAM region 1000. Also, gate electrodes 17c are formed in the peripheral circuit region 2000 and the logic circuit region 3000.

Next, an N type impurity (for example, phosphorous) is ion-implanted in the active regions 13a, 13b, 13c and 13d, using the gate electrodes 17a and 17c as masks, to thereby form N$^-$ type impurity regions 29a, 29b, 29c and 29d.

Steps of forming a bit line 300 shown in FIG. 12 are described with reference to FIGS. 3 and 4.

Figure 3:
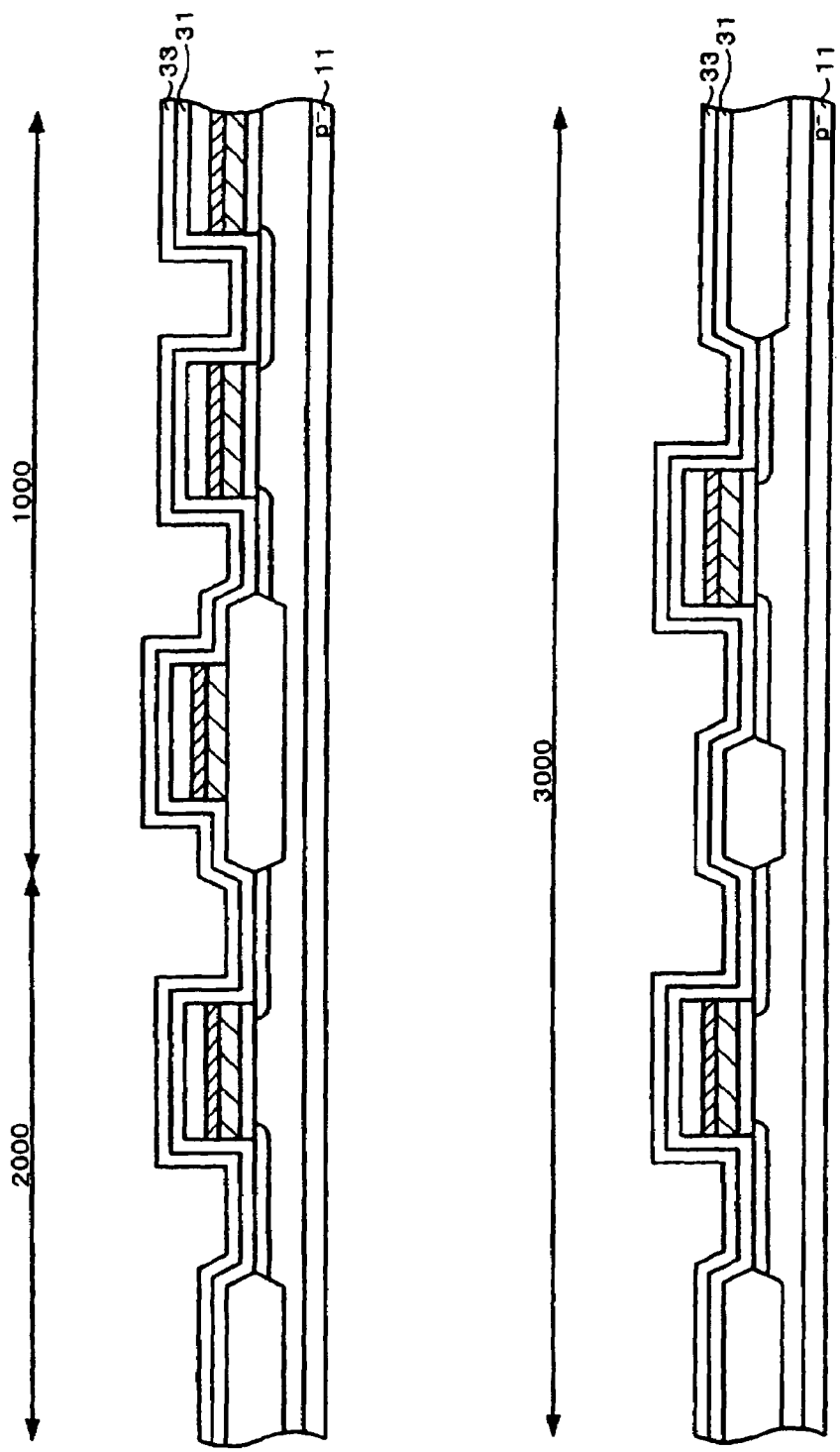
FIG. 3 schematically shows a cross section of the silicon substrate, which is used to describe a third step in a method for manufacturing a semiconductor device of an embodiment of the present invention.

As shown in FIG. 3, a TEOS layer 31 is formed in a manner to cover the P$^-$ type semiconductor substrate 11 by, for example, a CVD method. Then, a silicon nitride layer 33 is formed over the TEOS layer 31 by, for example, a CVD method. The TEOS layer 31 and the silicon nitride layer 33 function as an etching stopper in the succeeding steps, i.e., the step of forming a contact hole and the step of removing an interlayer dielectric layer.

Figure 4:
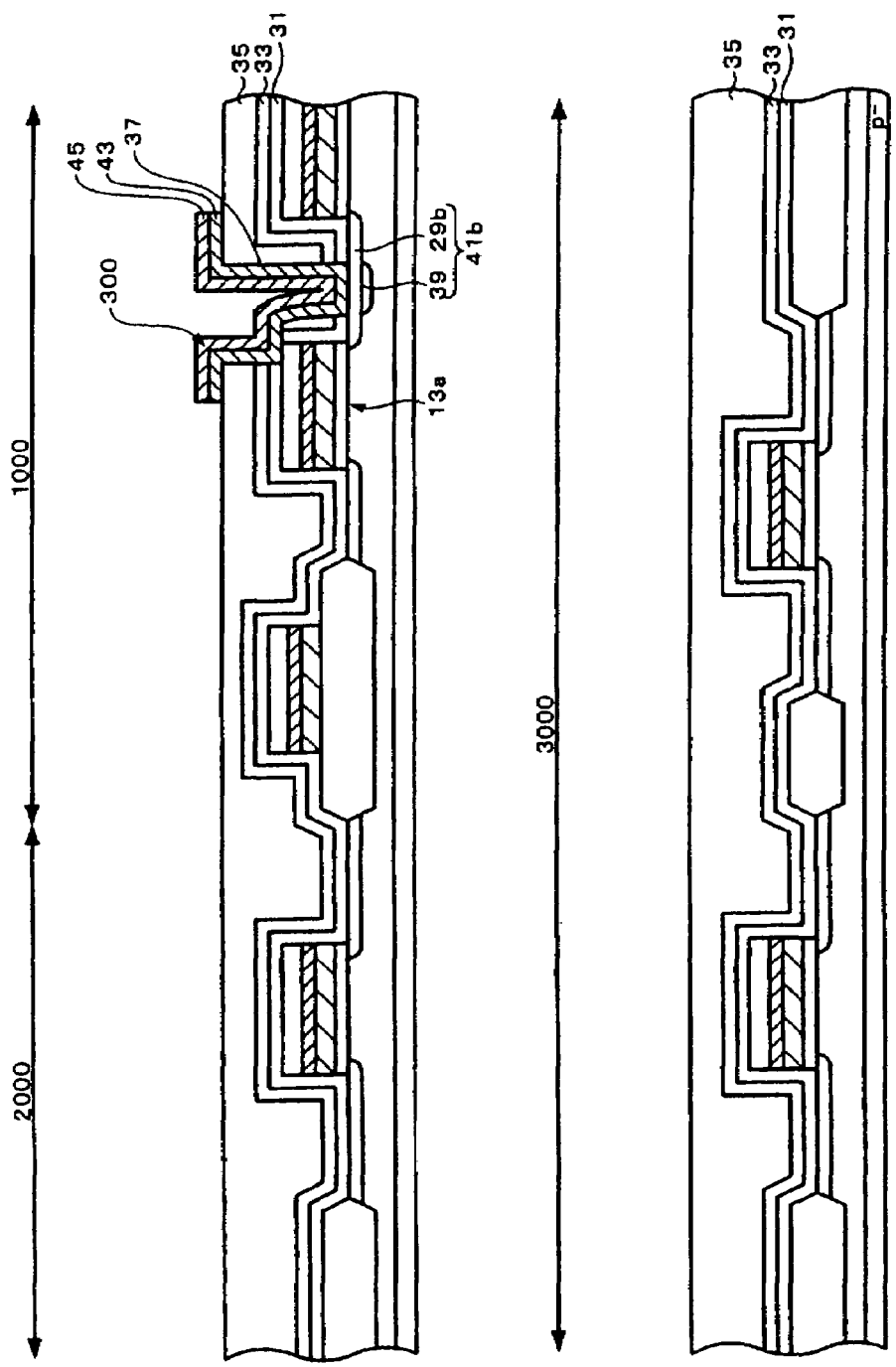
FIG. 4 schematically shows a cross section of the silicon substrate, which is used to describe a fourth step in a method for manufacturing a semiconductor device of an embodiment of the present invention.

As shown in FIG. 4, an interlayer dielectric layer 35 that is composed of a silicon oxide layer is formed over the silicon nitride layer 33 by, for example, a CVD method. Then, a resist is formed over the interlayer dielectric layer 35. A layer composed of the interlayer dielectric layer 35, the silicon nitride layer 33 and the TEOS layer 31 is selectively etched, using the resist as a mask, to form a contact hole 37 that reaches the N$^-$ type impurity region 29b. The step of forming the contact hole 37 is described in detail below.

In the step of forming the contact hole 37, first, the interlayer dielectric layer 35 is etched with the resist functioning as a mask. In this etching step, the silicon nitride layer 33 functions as an etching stopper. After the resist is removed, the silicon nitride layer 33 is etched. In this etching step, the TEOS layer 31 functions as an etching stopper. Then, lastly, the TEOS layer 31 is etched. By the steps described above, the contact hole 37 is formed in a self-alignment manner. By forming the contact hole 37 in this manner, the gate electrode 17a is prevented from being exposed through the contact hole 37. Then, an N type impurity (for example, phosphorous) is ion-implanted in the active region 13a, using the interlayer dielectric layer 35 as a mask, to form an N$^+$ type impurity region 39. The N$^+$ type impurity region 39 and the N$^-$ type impurity region 29b form an N$^+$ type source/drain region 41b.

Next, a doped amorphous silicon layer is formed on the interlayer dielectric layer 35 by using, for example, a CVD method. The doped amorphous silicon layer becomes a silicon layer 43 that is a component of the bit line. The doped amorphous silicon layer becomes a polycrystal silicon layer 43 in a heat treatment conducted during the manufacturing process. Then, a tungsten silicide layer 45 is formed over the doped amorphous silicon layer by using, for example, a CVD method. A structure composed of the doped amorphous silicon layer and the tungsten silicide layer 45 is subject to a specified patterning by, for example, photolithography and etching. As a result, a bit line 300 is formed in the DRAM region 1000. The bit line 300 is also formed on the inside of the contact hole 37 and electrically connects to the N$^+$ type source/drain region 41b.

Steps of forming a doped polycrystal silicon layer that becomes a storage node 53 and a cell plate 67 shown in FIG. 12 are described with reference to FIGS. 5 and 6.

Figure 5:
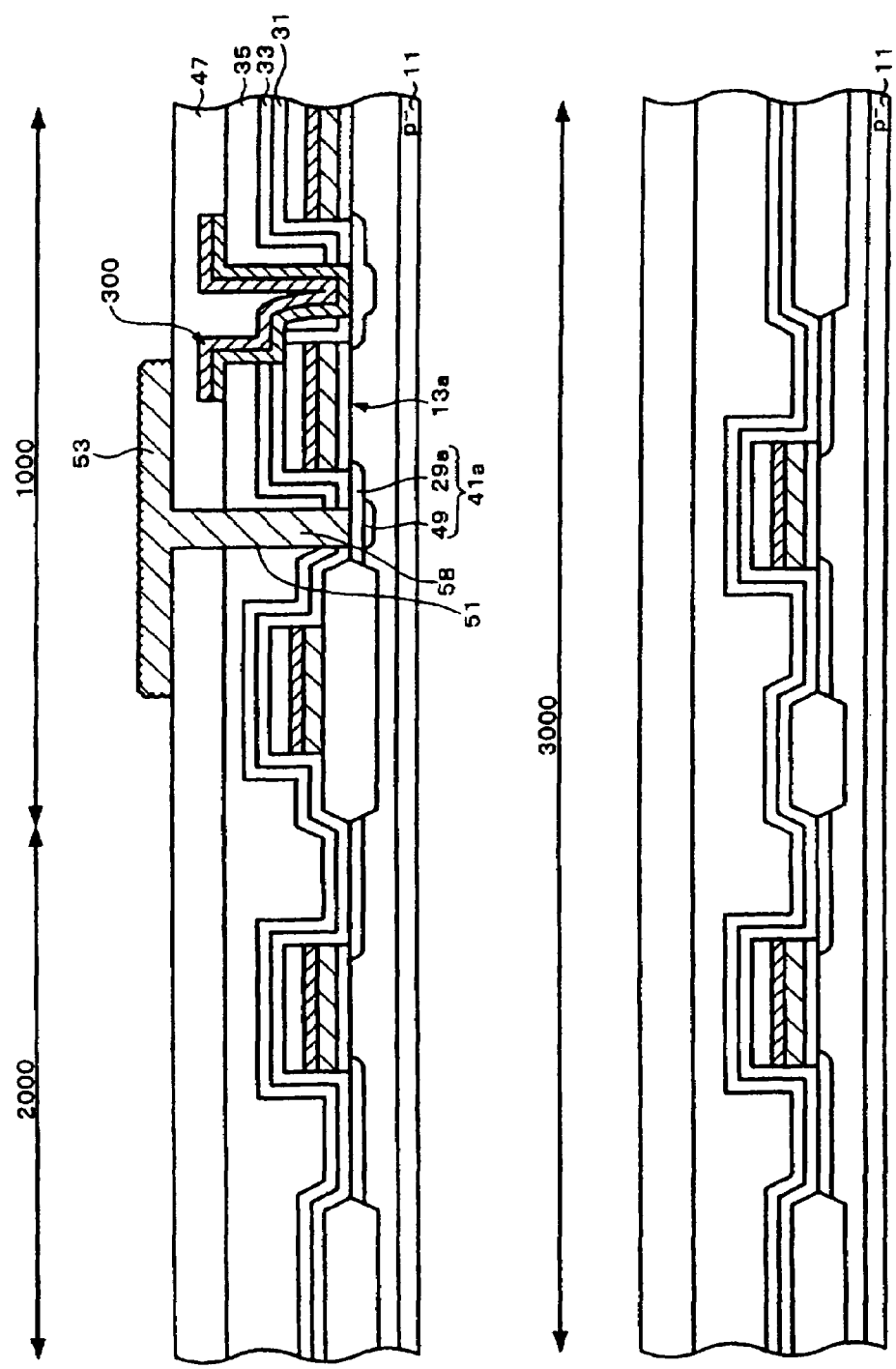
FIG. 5 schematically shows a cross section of the silicon substrate, which is used to describe a fifth step in a method for manufacturing a semiconductor device of an embodiment of the present invention.

As shown in FIG. 5, an interlayer dielectric layer 47 that is composed of a silicon oxide layer is formed over the surface of the P$^-$ type semiconductor substrate 11 in a manner to cover the bit line 300 by, for example, a CVD method. Then, a resist is formed over the interlayer dielectric layer 47. A layer composed of the interlayer dielectric layers 47 and 35, the silicon nitride layer 33 and the TEOS layer 31 is selectively etched, using the resist as a mask, to form a contact hole 51. The contact hole 51 reaches the N$^-$ type impurity region 29a.

Then, an N type impurity (for example, phosphorous) is ion-implanted in the active region 13a, using the interlayer dielectric layer 47 as a mask, to form an N$^+$ type impurity region 49. The N⁺ type impurity region 49 and the N⁻ impurity region 29a form an N⁺ type source/drain region 41a.

Then, a doped amorphous silicon layer is formed over the interlayer dielectric layer 47 and on the inside of the contact hole 51 by, for example, a CVD method. The doped amorphous silicon layer over the interlayer dielectric layer 47 becomes a storage node. The doped amorphous silicon layer inside the contact hole 51 becomes a conductive layer 58. The doped amorphous silicon layer becomes a silicon layer having a polycrystal structure in a heat treatment conducted during the manufacturing process.

Next, the doped amorphous silicon layer is subject to a specified patterning by, for example, photolithography and etching. As a result, a storage node 53 is formed in the DRAM region 1000. The surface of the storage node 53 is preferably roughened by a known method. As a result, the surface area of the storage node 53 becomes greater, which increases the storage capacity of the capacitor.

Figure 6:
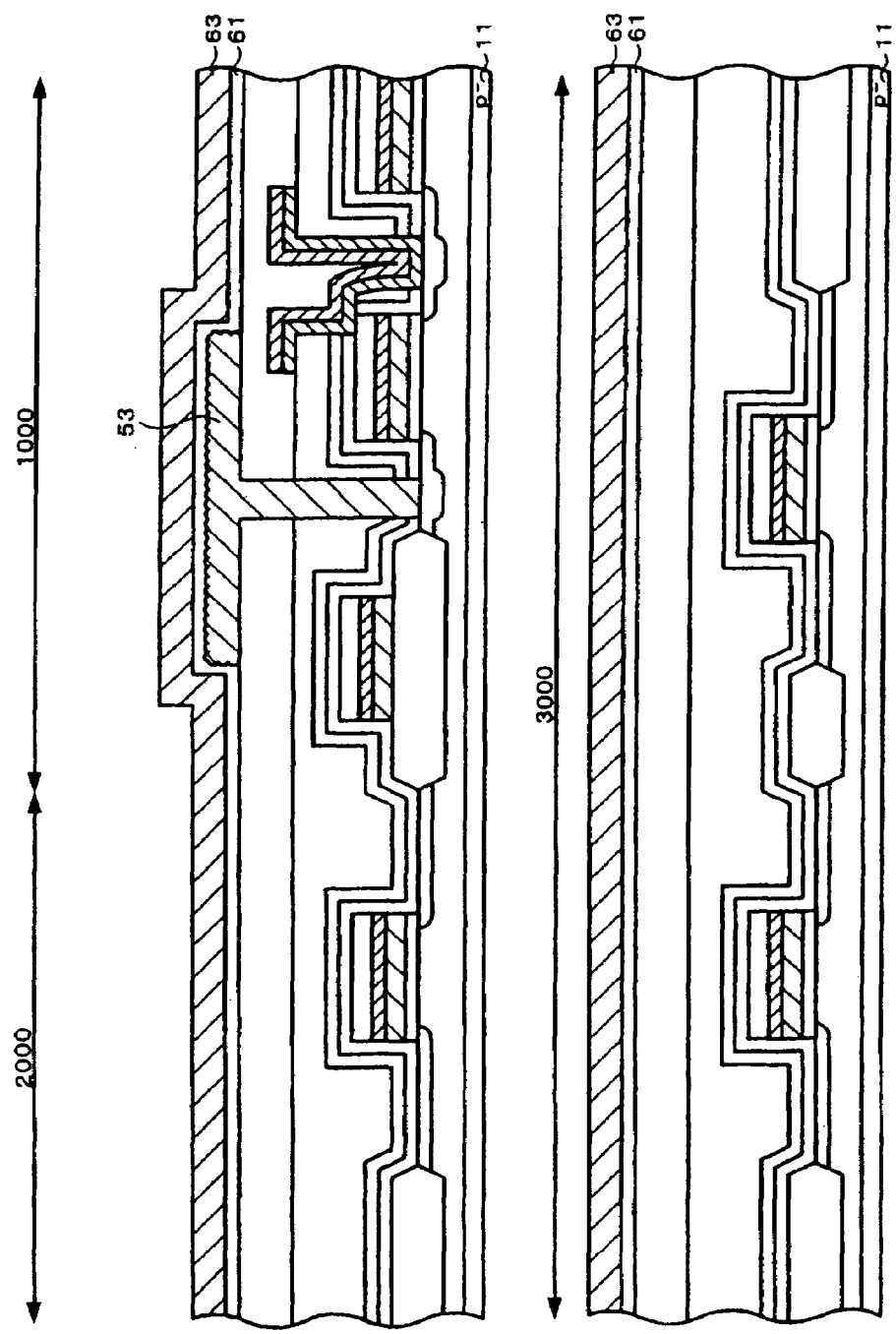
FIG. 6 schematically shows a cross section of the silicon substrate, which is used to describe a sixth step in a method for manufacturing a semiconductor device of an embodiment of the present invention.

Then, as shown in FIG. 6, a silicon nitride layer is formed in a manner to cover the storage node 53 over the surface of the P⁻ type semiconductor substrate 11 by, for example, a CVD method. This may be conducted, for example, at a temperature of 650° C. for 15 minutes. The silicon nitride layer is thermally oxidized to form a silicon oxide layer on the surface of the silicon nitride layer, which define an ON layer 61. The thermal oxidation may be conducted, for example, at a temperature of 820° C. for 13 minutes.

Then, a doped polycrystal silicon layer 63 that becomes a cell plate is formed in a manner to cover the ON layer 61 over the surface of the P⁻ type semiconductor substrate 11 by, for example, a CVD method.

Steps of forming MOS field effect transistors 200c, 200d and 200e shown in FIG. 12 are described with reference to FIGS. 7 through 9.

Figure 7:
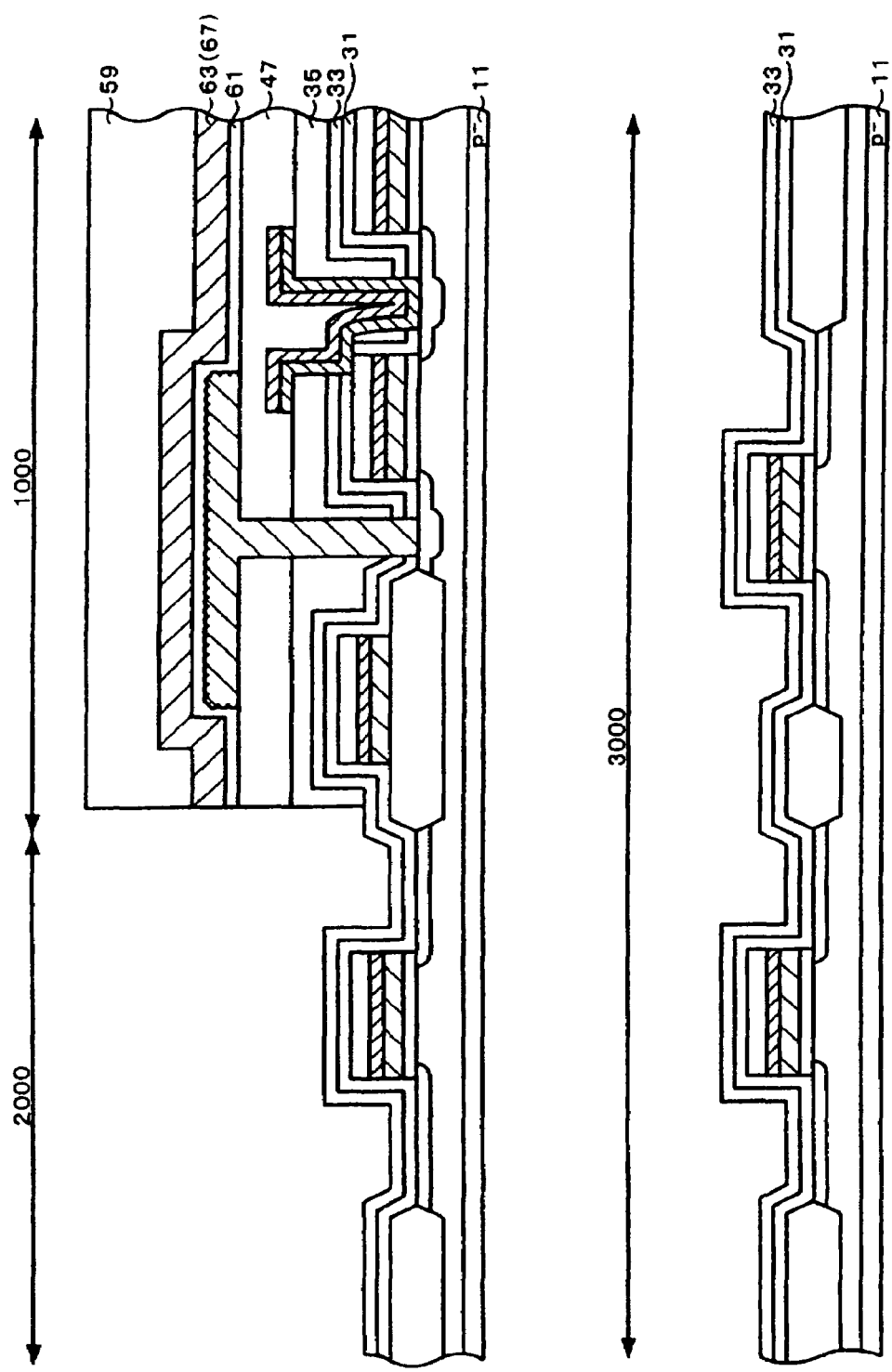
FIG. 7 schematically shows a cross section of the silicon substrate, which is used to describe a seventh step in a method for manufacturing a semiconductor device of an embodiment of the present invention.

As shown in FIG. 7, a resist 59 is formed over the surface of the P⁻ type semiconductor substrate 11. Then, the resist 59 is selectively removed in a manner to leave the resist 59 over the doped polycrystal silicon layer 63 that is located in the DRAM region 1000.

Then, the doped polycrystal silicon layer 63, the ON layer 61, the interlayer dielectric layer 47 and the interlayer dielectric layer 35 are successively etched and removed, using the resist 59 as a mask. In this step, since the silicon nitride layer 33 has a different etching rate from that of the interlayer dielectric layer 35 (silicon oxide layer), the silicon nitride layer 33 functions as an etching stopper. In this case, when the interlayer dielectric layer 47 and the interlayer dielectric layer 35 are removed by a wet etching method, for example, using HF, the silicon nitride layer 33 can securely function as an etching stopper layer. The interlayer dielectric layers 47 and 35 can also be removed by a dry etching method. It is noted that the doped polycrystal silicon layer 63 that remains in the DRAM region 1000 becomes a cell plate 67.

Figure 8:
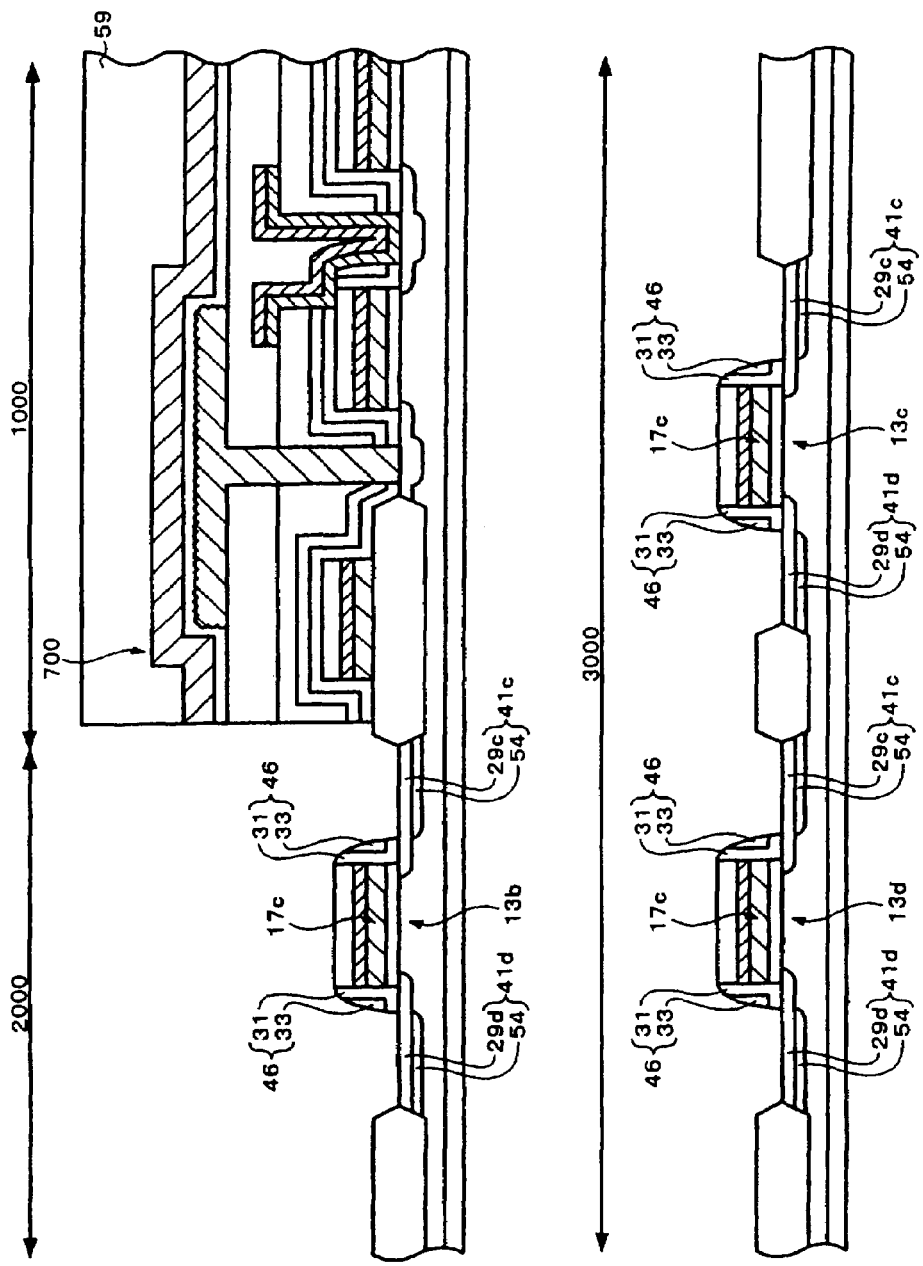
FIG. 8 schematically shows a cross section of the silicon substrate, which is used to describe an eighth step in a method for manufacturing a semiconductor device of an embodiment of the present invention.

As shown in FIG. 8, the silicon nitride layer 33 and the TEOS layer 31 that are located in the peripheral circuit region 2000 and the logic circuit region 3000 are successively etched across their surfaces, to thereby form sidewalls 46 on side walls of the gate electrode 17c. Then, the resist 59 is removed.

Then, an N type impurity (for example, phosphorous) is ion-implanted in the active regions 13b, 13c and 13d, using the sidewalls 46 and the gate electrode 17c as masks, to form an N⁺ type impurity region 54. The N⁺ type impurity region 54 and the N⁻ type impurity region 29c form an N⁺ type source/drain region 41c. Also, the N⁺ type impurity region 54 and the N⁻ type impurity region 29d form an N⁺ type source/drain region 41d.

Figure 9:
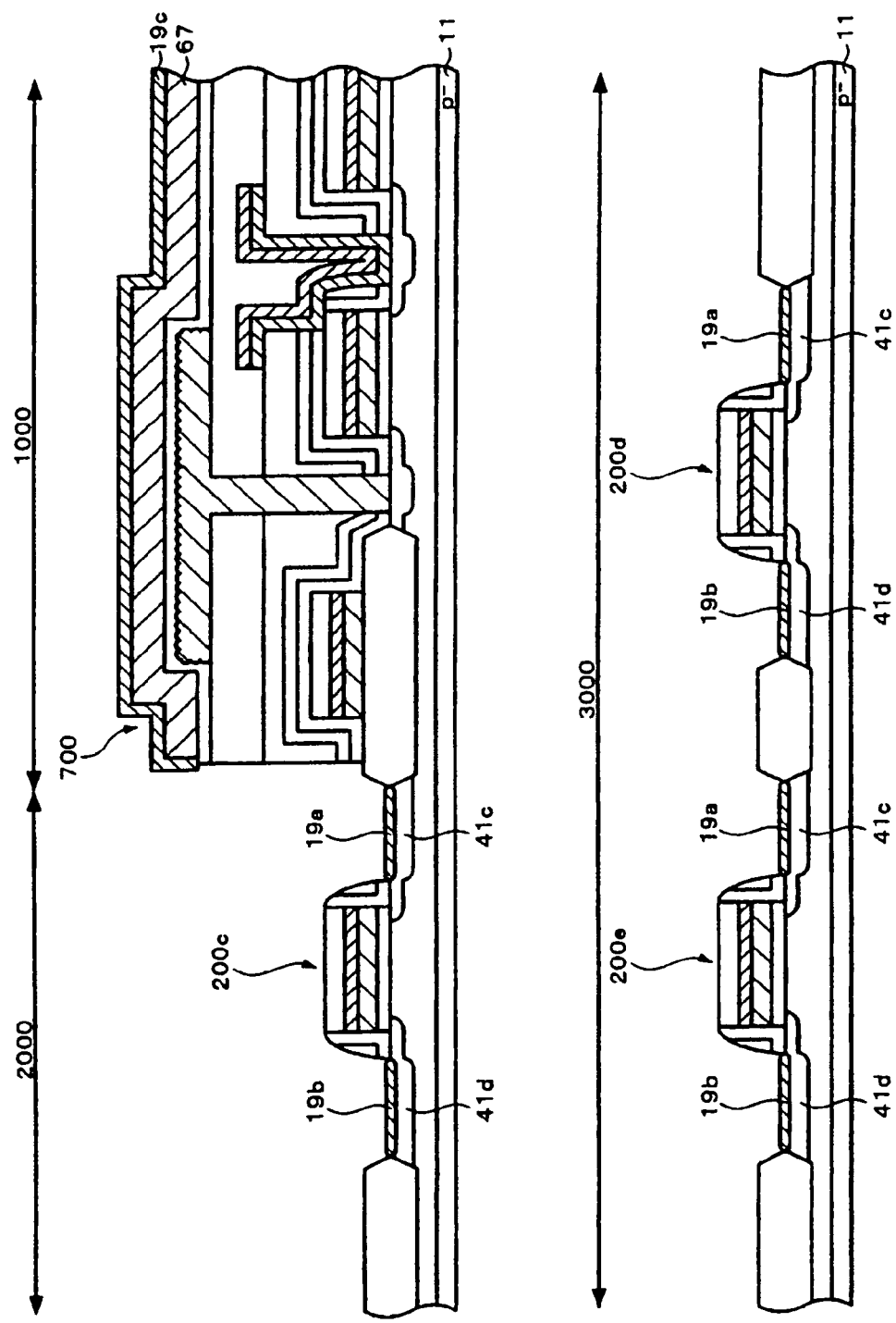
FIG. 9 schematically shows a cross section of the silicon substrate, which is used to describe a ninth step in a method for manufacturing a semiconductor device of an embodiment of the present invention.

As shown in FIG. 9, a titanium layer is formed over the surface of the P⁻ type semiconductor substrate 11. Then, the titanium layer is subject to a first thermal treatment in, for example, a nitrogen atmosphere. As a result, a silicide layer of titanium is formed. Then, the titanium nitride layer and non-reacted portions of the titanium layer are removed by, for example, a wet etching method. As a result, silicide layers 19a, 19b and 19c are left over the N⁺ type source/drain region 41c, the N⁺ type source/drain region 41d and the cell plate 67, respectively. Then, for example, a second heat treatment is conducted. By the second heat treatment, the silicide layers 19a, 19b and 19c undergo a phase transition from a high resistance crystal structure (C49 structure) to a low resistance crystal structure (C54 structure).

Figure 10:
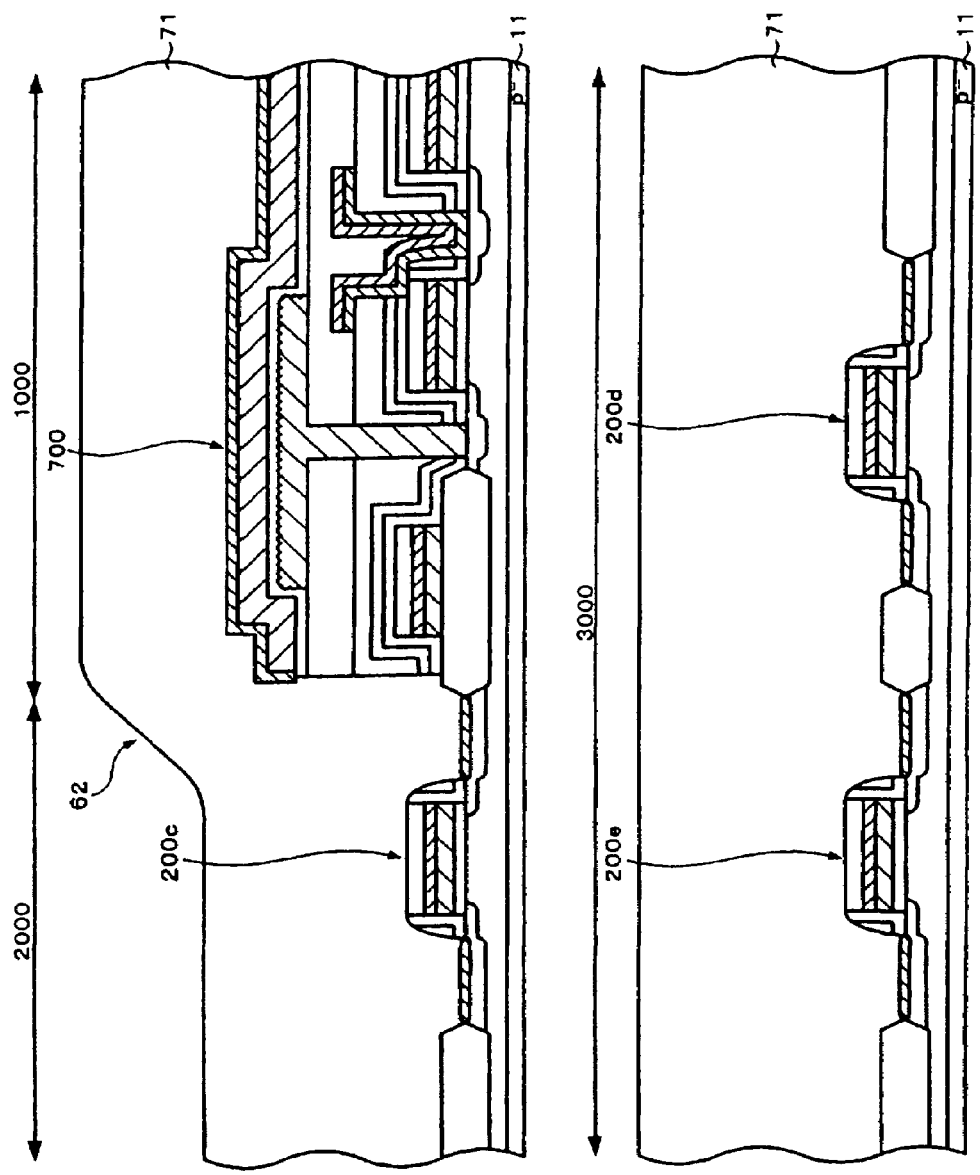
FIG. 10 schematically shows a cross section of the silicon substrate, which is used to describe a tenth step in a method for manufacturing a semiconductor device of an embodiment of the present invention.

As shown in FIG. 10, an interlayer dielectric layer 71 that is composed of a silicon oxide layer is formed over the surface of the P⁻ type semiconductor substrate 11 in a manner to cover the capacitor 700 and the MOS field effect transistors 200c, 200d and 200e by, for example, a CVD method. A step 62 is formed in the interlayer dielectric layer 71 at a border between the DRAM region 1000 and the peripheral circuit region 2000. The step 62 is created due to differences in the device density, the number of interlayer dielectric layers and the like.

Figure 11:
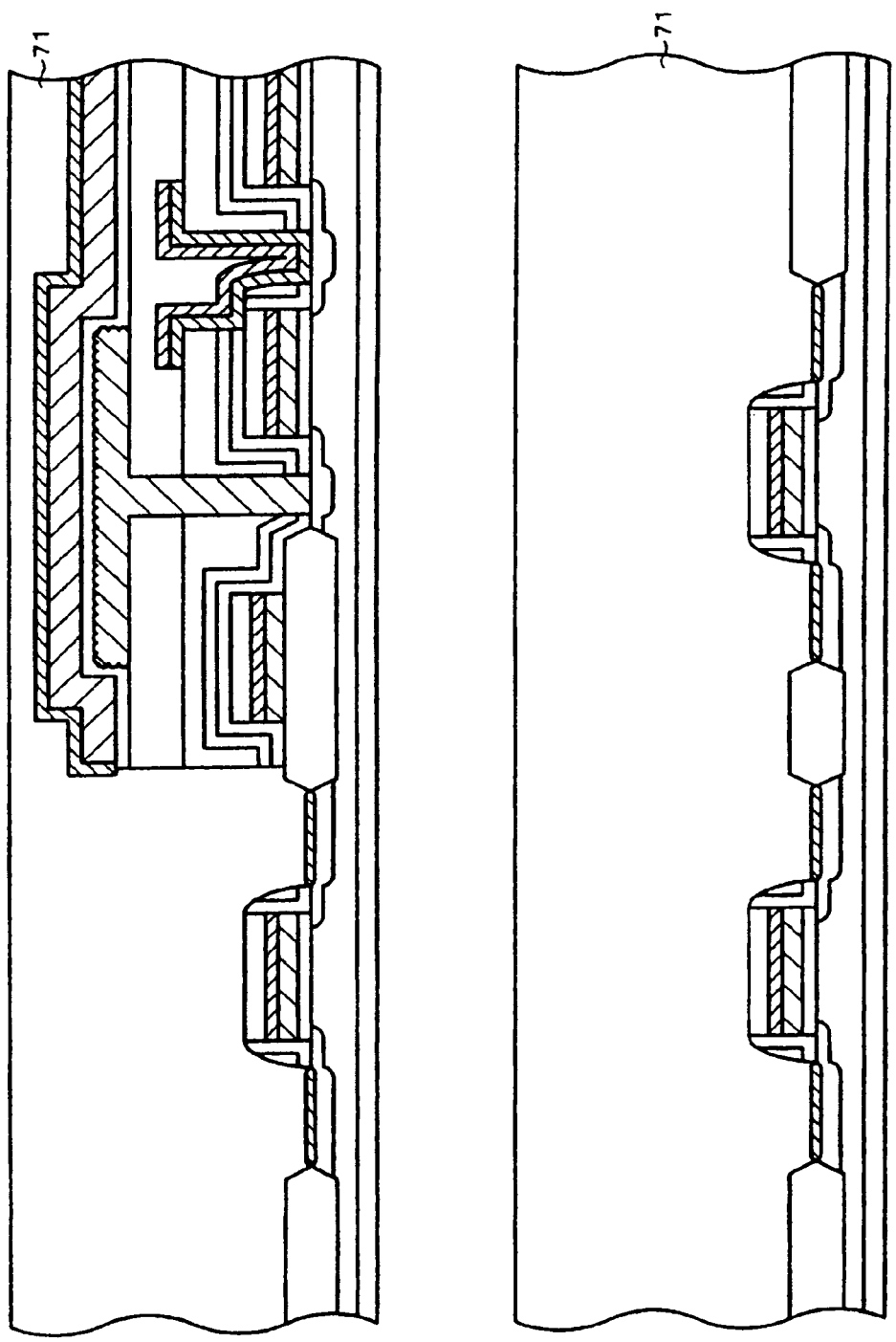
FIG. 11 schematically shows a cross section of the silicon substrate, which is used to describe an eleventh step in a method for manufacturing a semiconductor device of an embodiment of the present invention.

Then, as shown in FIG. 11, the interlayer dielectric layer 71 is preferably polished by a CMP method for three minutes using a slurry containing silica in a NH₃ based solution and a polishing pad, to thereby planarize the interlayer dielectric layer 71.

Then, as shown in FIG. 12, a plurality of wirings such as, for example, aluminum wirings 75 are formed over the interlayer dielectric layer 71 by a known method.

By the manufacturing steps described above, the semiconductor device 1 shown in FIG. 12 is completed. By using a preferred method for manufacturing the semiconductor device 1, the following effects are preferably created.

First, in accordance with certain embodiments of the present invention, after the capacitor 700 of the DRAM is formed, the silicide layers 19a and 19b are formed over the N⁺ type source/drain regions 41c and 41d of the MOS field effect transistors 200c, 200d and 200e. Therefore, the capacitor 700 is inhibited of prevented from being polluted with metals. Accordingly, in accordance with one embodiment of the present invention, the characteristic of the capacitor of the DRAM can be inhibited or prevented from being deteriorated.

Second, in accordance with certain embodiments of the present invention, after the capacitor 700 of the DRAM is formed, the silicide layers 19a and 19b are formed over the N⁺ type source/drain regions 41c and 41d of the MOS field effect transistors 200c, 200d and 200e. As a result, the silicide layers 19a and 19b should not be significantly affected by heat, and therefore the resistance of the silicide layers 19a and 19b can be inhibited or prevented from increasing. It is noted that the heat mentioned above refers to the heat that is used in the step of thermally oxidizing a silicon nitride layer in the formation of the ON layer 61 (at 820° C., as described above with reference to FIG. 6) and in the steps of forming the interlayer dielectric layers 35 and 47 (over 800° C.).

Third, in accordance with certain embodiments of the present invention, after the capacitor 700 is formed, the MOS field effect transistors 200c, 200d and 200e are formed.

Accordingly, as shown in FIG. 7, the doped polycrystal silicon layer 63, the ON layer 61, the interlayer dielectric layer 47 and the interlayer dielectric layer 35 need to be successively etched and removed, using the resist 59 as a mask. In accordance with one embodiment of the present invention, the silicon nitride layer 33 is formed below the interlayer dielectric layer (silicon oxide layer) 35. Since the silicon nitride layer 33 has an etching rate different from those of the interlayer dielectric layer 47 and the interlayer dielectric layer 35 (silicon oxide layer), the silicon nitride layer 33 functions as an etching stopper, when the etching and removal step described above is conducted. As a result, when the interlayer dielectric layers 47 and 35 are etched and removed, an underlying layer such as a field oxide layer is prevented from being etched at areas where the thickness of the interlayer dielectric layer (in this case, the interlayer dielectric layer 35 and the interlayer dielectric layer 47 are considered to be one interlayer dielectric layer) is small. Therefore, the occurrence of problems, such as, for example, a lowered element isolation dielectric strength and the like, is inhibited or prevented.

Fourth, as shown in FIG. 11, in accordance with one embodiment of the present invention, the interlayer dielectric layer 71 is planarized by a CMP method. As a result, the reliability of the aluminum wirings 75 can be improved.

The embodiments of the present invention have a variety of modifications. Certain modified embodiments will be described below.

Figure 13:
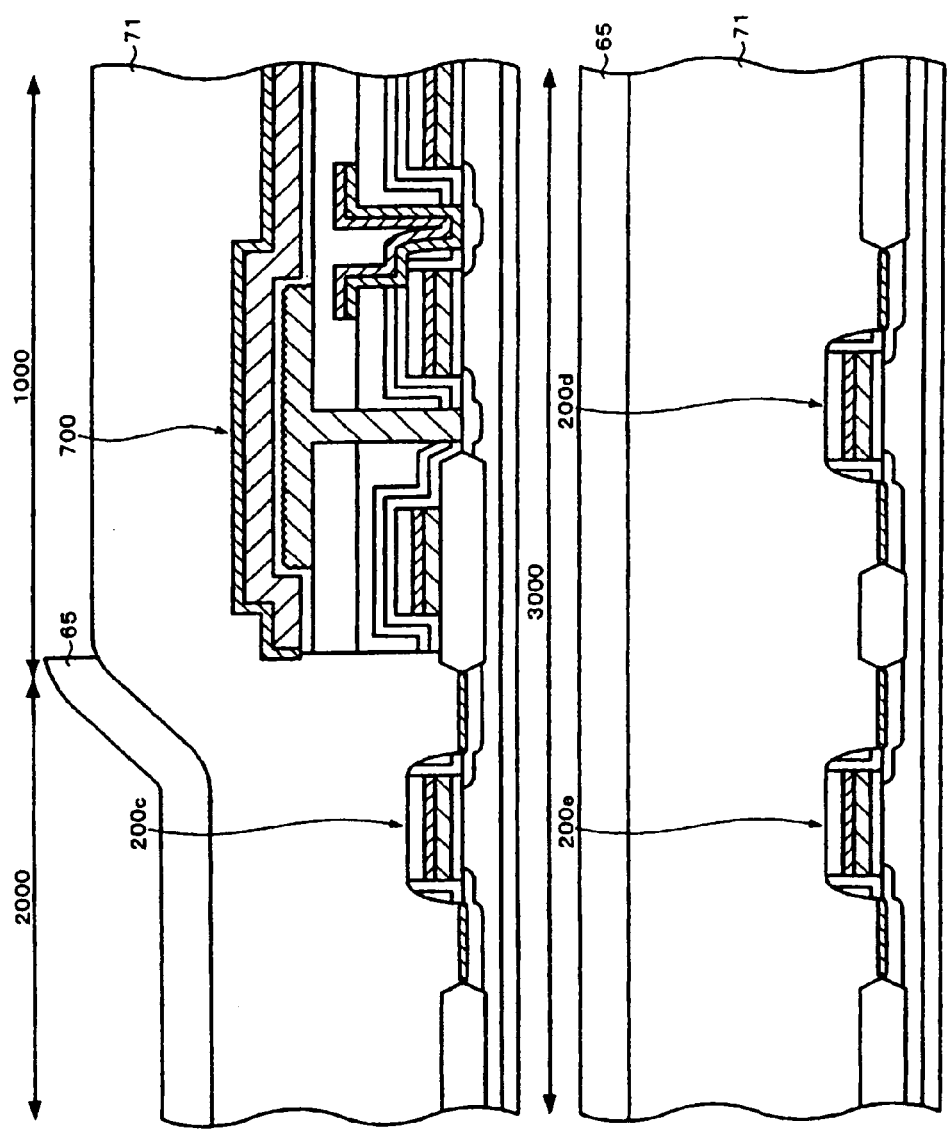
FIG. 13 schematically shows a cross section of a silicon substrate, which is used to describe a modified embodiment of the present invention.

FIG. 13 shows the planarization step for the interlayer dielectric layer 71 in accordance with a modified embodiment of the present invention. In this modified embodiment, initially, a resist 65 is formed over the surface of the interlayer dielectric layer 71. Then, the resist 65 is selectively exposed to light and developed to remove the resist 65 that is located over the DRAM region 1000. As a result, the resist 65 remains on the interlayer dielectric layer 71 at areas located above the peripheral circuit region 2000 and the logic circuit region 3000. Then, the interlayer dielectric layer 71 located above the DRAM region 1000 is etched, using the resist 65 as a mask, to planarize the interlayer dielectric layer 71.

Figure 14:
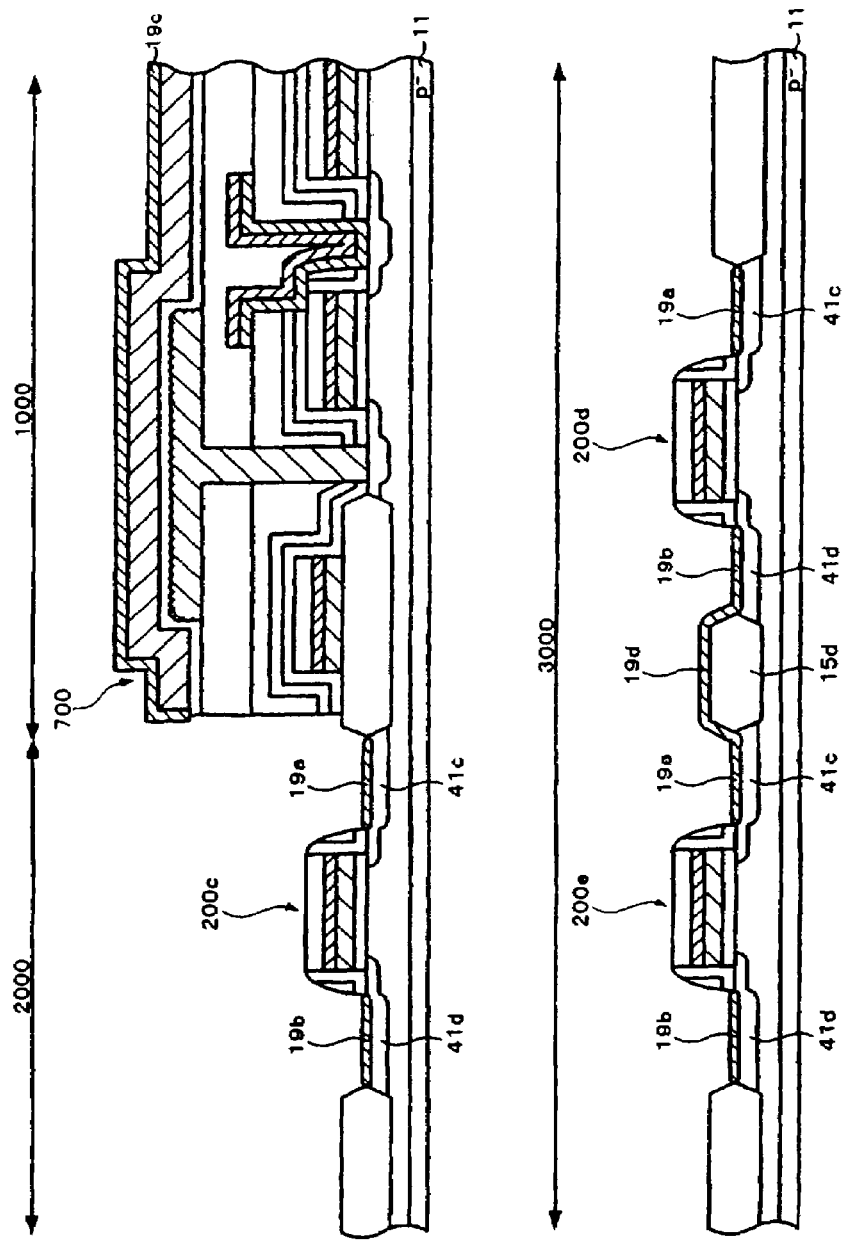
FIG. 14 schematically shows a cross section of a silicon substrate, which is used to describe another modified embodiment of the present invention.

FIG. 14 shows a step of forming a silicide wiring layer 19d in accordance with another modified embodiment. The silicide wiring layer 19d is located above the field oxide layer 15d. The silicide wiring layer 19d connects the N$^+$ type source/drain region 41c of the MOS field effect transistor 200e to the N$^+$ type source/drain region 41d of the MOS field effect transistor 200d.

Steps of forming the silicide wiring layer 19d are described. First, a titanium silicide layer is formed over the surface of the P$^-$ type semiconductor substrate 11. Then, the silicide layer is selectively removed by, for example, photolithography and etching, to form the silicide layers 19a, 19b, 19c and 19d.

In accordance with the modified embodiment described above, the N$^+$ type source/drain region 41c of the MOS field effect transistor 200e can be connected to the N$^+$ type source/drain region 41d of the MOS field effect transistor 200d, without adding steps of forming wiring layers.

Figure 15:
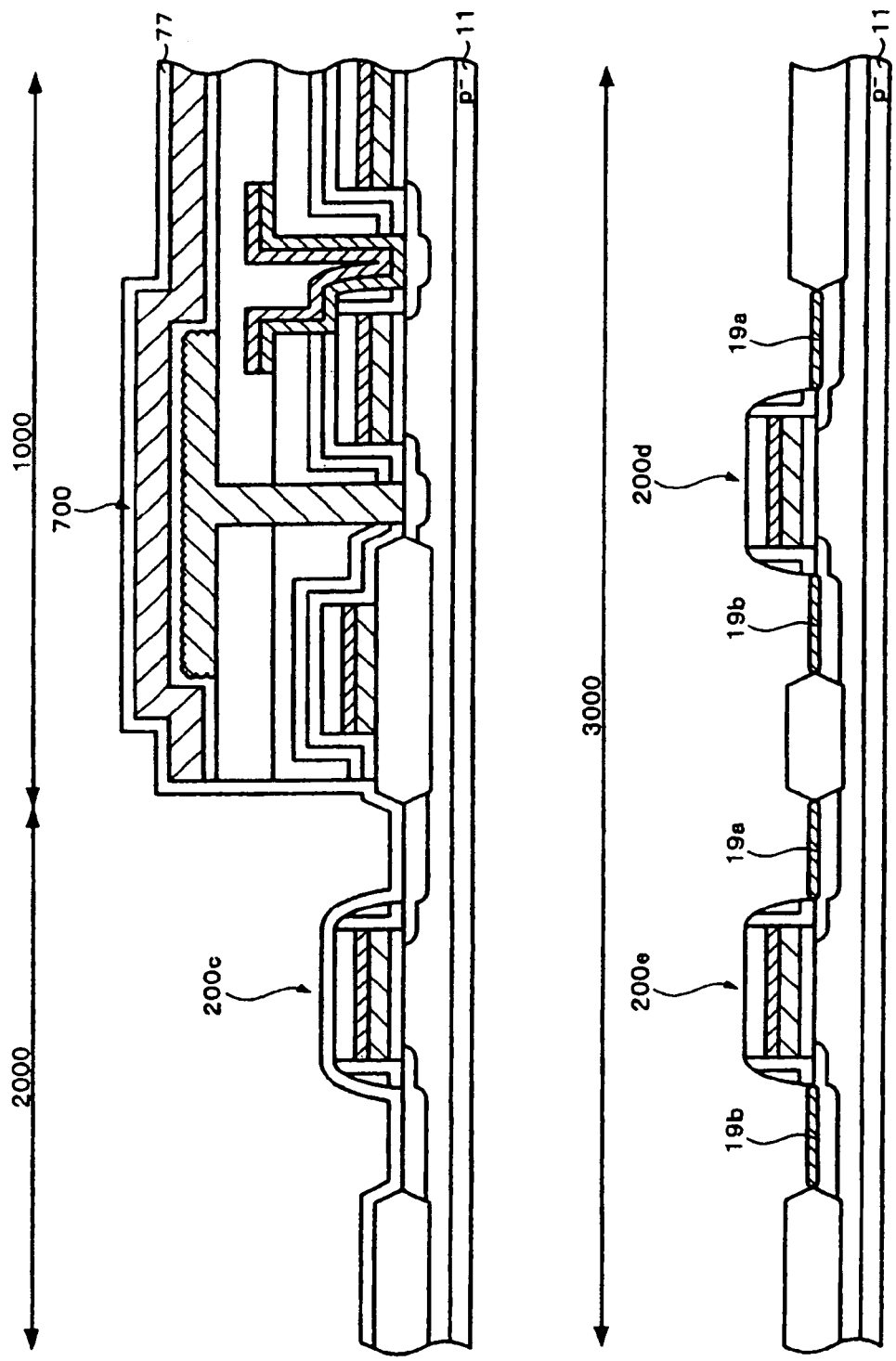
FIG. 15 schematically shows a cross section of a silicon substrate, which is used to describe another modified embodiment of the present invention.

FIG. 15 is an illustration to describe steps of selectively forming a silicide layer in accordance with another modified embodiment. First, after the step shown in FIG. 8, a protection layer 77 is formed over the surface of the P$^-$ type semiconductor substrate 11, as shown in FIG. 15. The protection layer 77 may be formed from, for example, a silicon oxide layer. The protection layer 77 is selectively removed by, for example, photolithography and etching. As a result, the protection layer 77 remains in the DRAM region 1000 and the peripheral circuit region 2000. The protection layer 77 does not remain in the logic circuit region 3000. Then, when the silicide layer forming step described with reference to FIG. 9 is conducted, the silicide layers 19a and 19b are formed only in the logic circuit region 3000, as shown in FIG. 15.

A silicide layer is not formed at the source/drain of the MOS field effect transistor 200c in the peripheral circuit region 2000 because of the following reasons. When a DRAM macro cell (a memory cell and a peripheral circuit) and a logic circuit are mix-mounted, a silicide layer is not formed at a source/drain of the MOS field effect transistor in the DRAM region 1000. This is to reduce the leak current. When a DRAM macro cell is designed, using memory cells of a general-purpose DRAM, the design of the DRAM macro cell becomes easier if a silicide layer is not present at the source/drain of the MOS field effect transistor located in the peripheral circuit region 2000.

In another modified embodiment, a MOS field effect transistor located in the peripheral circuit region 2000 and a MOS field effect transistor located in the logic circuit region 3000 are formed independently from each other. This embodiment is described below.

Figure 16:
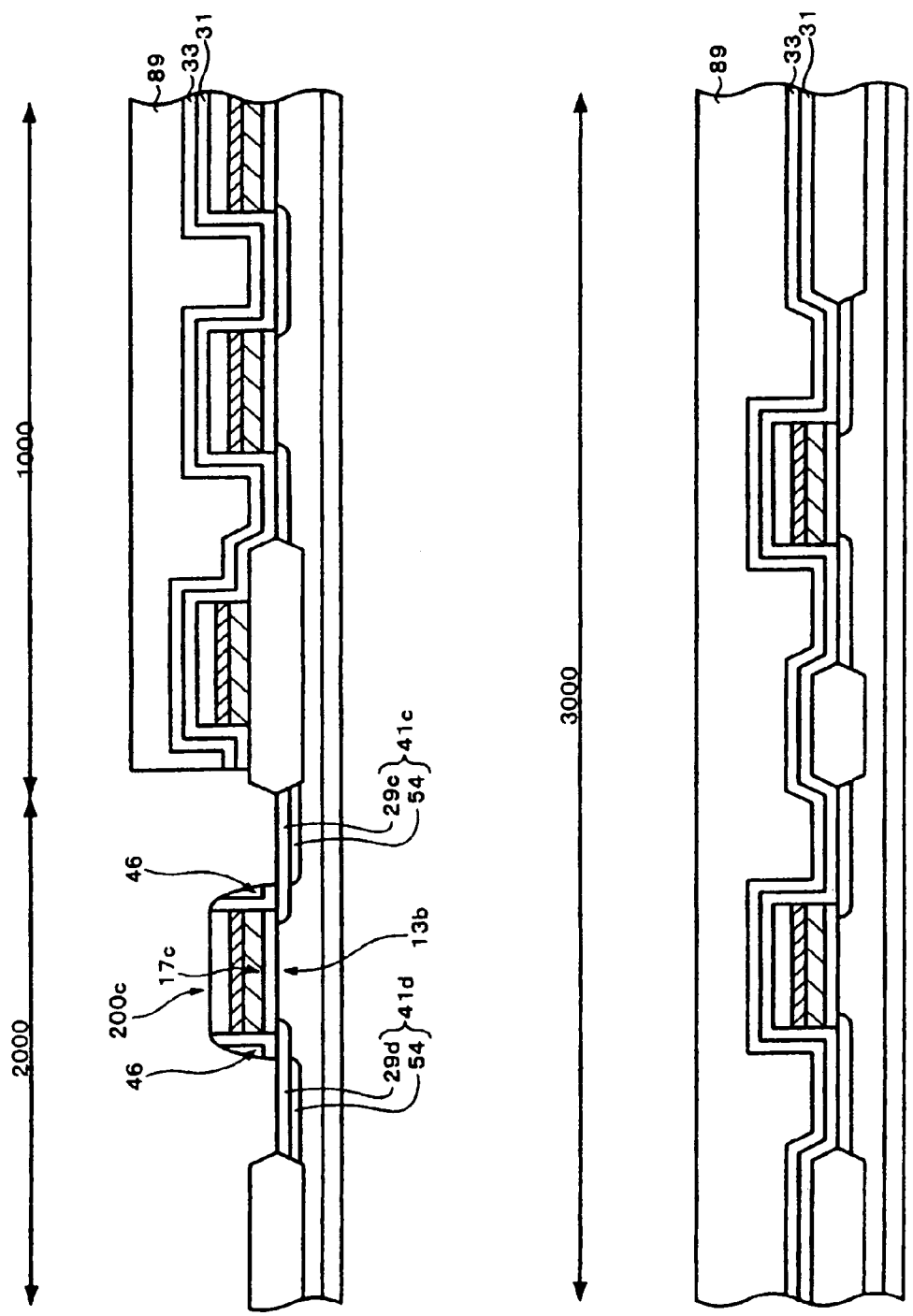
FIG. 16 schematically shows a cross section of a silicon substrate, which is used to describe a first step of another modified embodiment of the present invention.

After the step shown in FIG. 3, a resist 89 is formed over the surface of the silicon nitride layer 33, as shown in FIG. 16. Then, the resist 89 is selectively exposed to light and developed, to remove the resist 89 located above the peripheral circuit region 2000. As a result, the resist 89 located above the DRAM region 1000 and the logic circuit region 3000 remains. Then, the silicon nitride layer 33 and the TEOS layer 31 located above the peripheral circuit region 2000 are etched, using the resist 89 as a mask, to form sidewalls 46 on both sides of the gate electrode 17c.

Then, an N type impurity (for example, phosphorous) is ion-implanted in the active region 13b, using the sidewalls 46, the gate electrode 17c and the resist 89 as masks, to form an N$^+$ type impurity region 54. The N$^+$ type impurity region 54 and the N$^-$ type impurity region 29c form an N$^+$ type source/drain region 41c. Also, the N$^+$ type impurity region 54 and the N$^-$ type impurity region 29d form an N$^+$ type source/drain region 41d. By the steps described above, the MOS field effect transistor 200c located in the peripheral circuit region 2000 is completed.

Then, steps are conducted until a doped polycrystal silicon layer 63 shown in FIG. 6 is formed.

Figure 17:
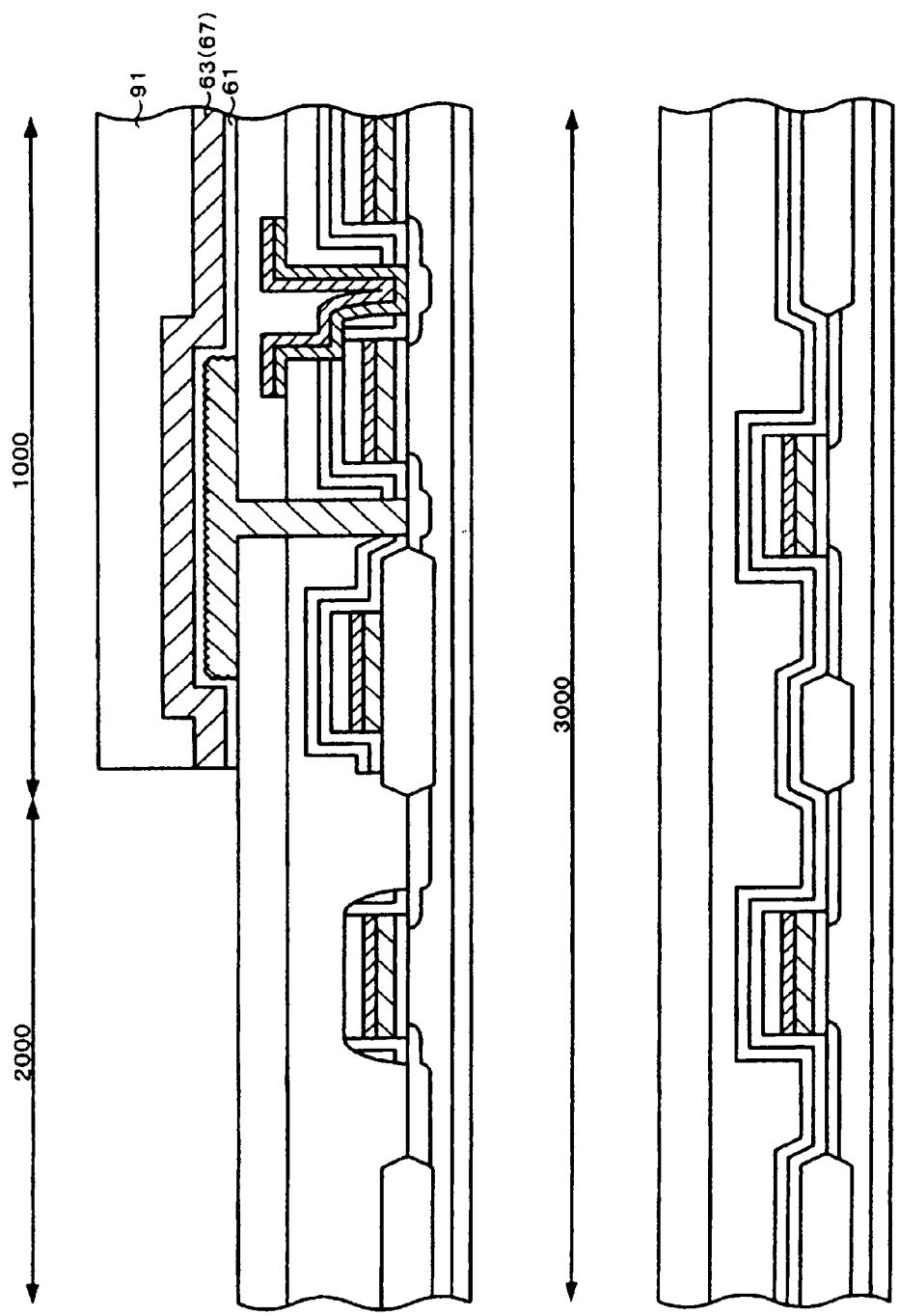
FIG. 17 schematically shows a cross section of the silicon substrate, which is used to describe a second step of the modified embodiment of FIG. 16.

Then, as shown in FIG. 17, a resist 91 is formed in the DRAM region 1000. The doped polycrystal silicon layer 63 and the ON layer 61 are selectively etched, using the resist 91 as a mask. As a result, a cell plate 67 is formed, and the doped polycrystal silicon layer 63 and the ON layer 61 are removed from the peripheral circuit region 2000 and the logic circuit region 3000.

Figure 18:
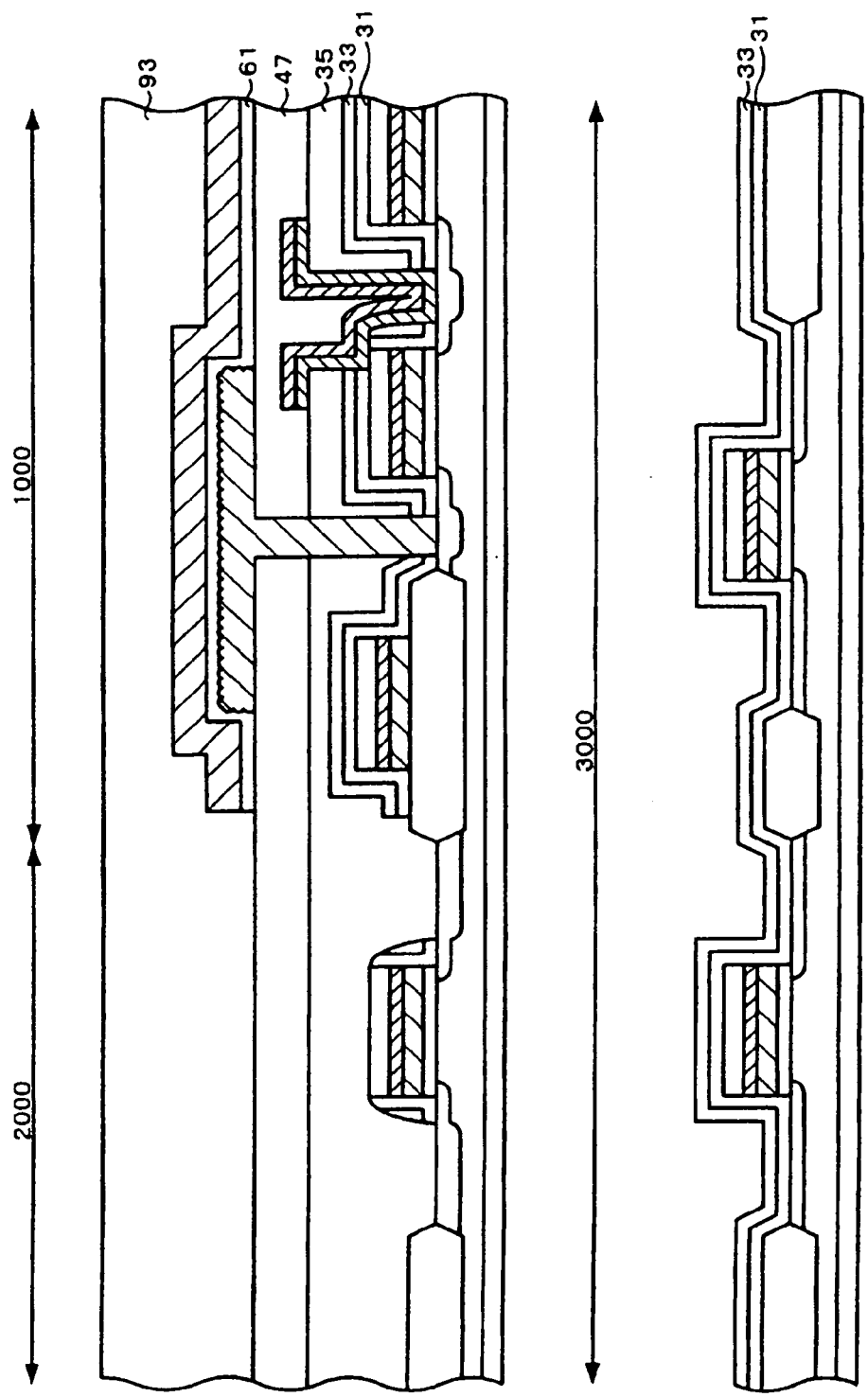
FIG. 18 schematically shows a cross section of the silicon substrate, which is used to describe a third step modified embodiment of FIGS. 16 and 17.

Next, as shown in FIG. 18, a resist 93 is formed in the DRAM region 1000 and the peripheral circuit region 2000. The interlayer dielectric layer 47 and the interlayer dielectric layer 35 located in the logic circuit region 3000 are successively etched and removed. In this step, since the silicon nitride layer 33 has a different etching rate than that of the interlayer dielectric layer 35 (silicon oxide layer), the silicon nitride layer 33 functions as an etching stopper.

Figure 19:
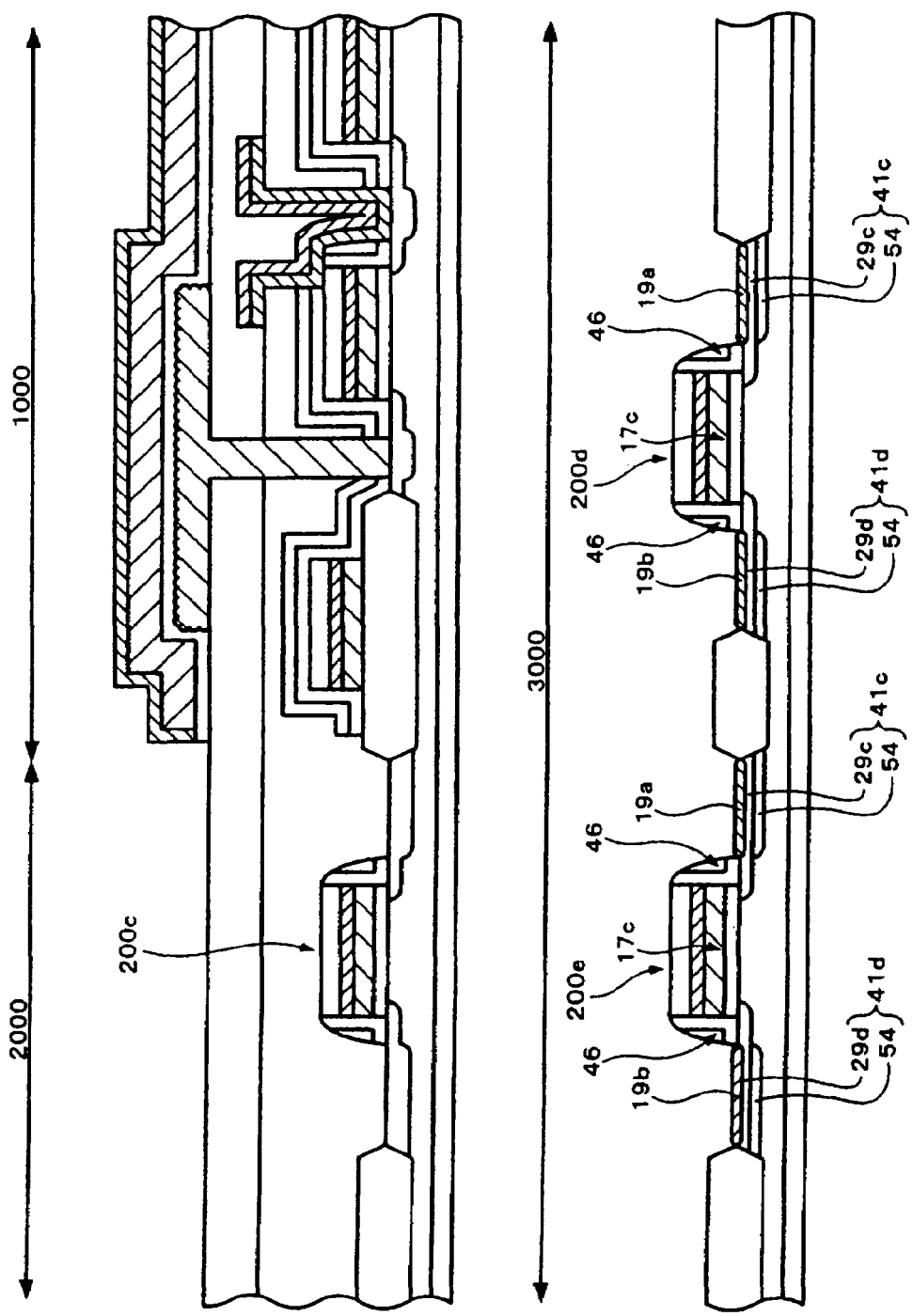
FIG. 19 schematically shows a cross section of the silicon substrate, which is used to describe a fourth step of the modified embodiment of FIGS. 16, 17 and 18.

Then, as shown in FIG. 19, the MOS field effect transistors 200d and 200e located in the logic circuit region 3000 are completed. These steps are the same as the steps described with reference to FIG. 8 and FIG. 9.

In accordance with this modified embodiment, the MOS field effect transistors 200d and 200e formed in the logic circuit region 3000 are formed independently of the steps for forming the MOS field effect transistor 200c that is formed in the peripheral circuit region 2000. As a result, the respective transistors can be optimized.

While the description above refers to particular embodiments of the present invention, it will be understood that many modifications may be made without departing from the spirit thereof. The accompanying claims are intended to cover modifications that fall within the true scope and spirit of the present invention.

What is claimed:

1. A semiconductor device comprising:
   a DRAM located in a memory cell region;
   a field effect transistor located in a field effect transistor region that is a region other than the memory cell region;
   wherein suicide layers are formed at a cell plate that is a component of a capacitor of the DRAM and at a source/drain that is a component of the field effect transistor;
   silicide layers are not formed at a source/drain that is a component of a memory cell selection field effect transistor of the DRAM;
   a silicide wiring layer;
   the silicide wiring layer being connected to the source/drain of the field effect transistor, and
   the silicide wiring layer being located in a common layer where the silicide layers at the source/drain of the field effect transistor are located.

2. A semiconductor device comprising:
   a DRAM located in a memory cell region;
   a first field effect transistor that is located in a peripheral circuit region and becomes a component of a peripheral circuit for the DRAM; and
   a second field effect transistor located in a region other than the memory cell region and the peripheral circuit region,
   wherein silicide layers are formed at a cell plate that is a component of a capacitor of the DRAM and at a source/drain of the second field effect transistor, and
   silicide layers are not formed at a source/drain that is a component of a memory cell selection field effect transistor of the DRAM or at a source/drain of the first field effect transistor.

3. A semiconductor device comprising:
   a memory cell region including a DRAM, the DRAM including a memory cell selection field effect transistor and source/drain regions, the DRAM also including a capacitor, the capacitor including first and second capacitor electrodes and a dielectric layer therebetween;
   a peripheral circuit region having a peripheral circuit field effect transistor and source/drain regions therein;
   a logic circuit region having a logic circuit field effect transistor and source/drain regions therein;
   wherein the source/drain regions of the logic circuit field effect transistor are in direct contact with a silicide material;
   wherein the source/drain regions of the memory cell selection field effect transistor are not in direct contact with a silicide material; and
   wherein one of the first and second capacitor electrodes is in direct contact with a silicide material.

4. A semiconductor device as in claim 3, wherein the source/drain regions in the peripheral circuit region are in direct contact with a silicide material.

5. A semiconductor device as in claim 3, wherein the source/drain regions in the peripheral circuit region are not in direct contact with a silicide layer.

6. A semiconductor device as in claim 3, further comprising an additional logic circuit field effect transistor, the additional logic circuit field effect transistor including source/drain regions that are in direct contact with a silicide material.

7. A semiconductor device as in claim 6, wherein a field oxide region is positioned between the logic circuit field effect transistor and the additional logic circuit field effect transistor, and a silicide material extends over the field oxide region between logic circuit field effect transistor and the additional logic circuit field effect transistor.

8. A semiconductor device as in claim 3, wherein the DRAM in the memory cell region includes including an additional memory cell selection field effect transistor and source/drain regions, wherein the source/drain regions of the additional memory cell selection field effect transistor are not in direct contact with a silicide layer.

9. A semiconductor device comprising:
   a memory cell region including a DRAM, the DRAM including a memory cell selection field effect transistor and source/drain regions, the DRAM also including a capacitor, the capacitor including first and second capacitor electrodes and a dielectric layer therebetween;
   a peripheral circuit region having a peripheral circuit field effect transistor and source/drain regions therein;
   a logic circuit region having a logic circuit field effect transistor and source/drain regions therein;
   wherein the source/drain regions of the logic circuit field effect transistor are in direct contact with a suicide material;
   wherein the source/drain regions of the memory cell selection field effect transistor are not in direct contact with a suicide material; and
   wherein the source/drain regions in the peripheral circuit region are not in direct contact with a silicide layer.

10. A semiconductor device comprising:
    a memory cell region including a DRAM, the DRAM including a memory cell selection field effect transistor and source/drain regions, the DRAM also including a capacitor, the capacitor including first and second capacitor electrodes and a dielectric layer therebetween;
    a peripheral circuit region having a peripheral circuit field effect transistor and source/drain regions therein;
    a logic circuit region having a logic circuit field effect transistor and source/drain regions therein;
    wherein the source/drain regions of the logic circuit field effect transistor are in direct contact with a suicide material;
    wherein the source/drain regions of the memory cell selection field effect transistor are not in direct contact with a silicide material;
    an additional logic circuit field effect transistor, the additional logic circuit field effect transistor including source/drain regions that are in direct contact with a silicide material; and
    wherein a field oxide region is positioned between the logic circuit field effect transistor and the additional logic circuit field effect transistor, and a silicide material extends over the field oxide region between logic circuit field effect transistor and the additional logic circuit field effect transistor.

* * * * *